United States Patent
Kitabatake et al.

(10) Patent No.: US 7,964,911 B2
(45) Date of Patent: Jun. 21, 2011

(54) SEMICONDUCTOR ELEMENT AND ELECTRICAL APPARATUS

(75) Inventors: Makoto Kitabatake, Nara (JP); Osamu Kusumoto, Hyogo (JP); Masao Uchida, Hyogo (JP); Kenya Yamashita, Hyogo (JP)

(73) Assignee: Panasonic Corporation, Osaka (JP)

( * ) Notice: Subject to any disclaimer, the term of this patent is extended or adjusted under 35 U.S.C. 154(b) by 666 days.

(21) Appl. No.: 11/996,855

(22) PCT Filed: Jul. 21, 2006

(86) PCT No.: PCT/JP2006/314516
§ 371 (c)(1),
(2), (4) Date: Jan. 25, 2008

(87) PCT Pub. No.: WO2007/013377
PCT Pub. Date: Feb. 1, 2007

(65) Prior Publication Data
US 2010/0148244 A1     Jun. 17, 2010

(30) Foreign Application Priority Data
Jul. 26, 2005 (JP) .................. 2005-215752

(51) Int. Cl.
*H01L 29/78* (2006.01)
(52) U.S. Cl. ... 257/328; 257/76; 257/341; 257/E27.001; 257/E29.257
(58) Field of Classification Search .......... 257/328, 257/E29.257, E27.016, 76, 77, 341, E27.001; 363/131
See application file for complete search history.

(56) References Cited

U.S. PATENT DOCUMENTS

| | | | |
|---|---|---|---|
| 5,086,324 A | 2/1992 | Hagino | |
| 5,111,253 A | 5/1992 | Korman et al. | |
| 5,253,156 A | 10/1993 | Sakurai et al. | |
| 5,915,179 A | 6/1999 | Etou et al. | |
| 6,476,456 B1 * | 11/2002 | Boden, Jr. ................. | 257/486 |
| 2002/0047124 A1 | 4/2002 | Kitabatake | |
| 2002/0190340 A1 | 12/2002 | Moriguchi et al. | |
| 2003/0080355 A1 | 5/2003 | Shirai et al. | |

FOREIGN PATENT DOCUMENTS

| | | |
|---|---|---|
| EP | 0 899 791 A2 | 3/1999 |
| EP | 1 204 145 A2 | 5/2002 |
| JP | 62-76671 | 4/1987 |
| JP | 62-076671 | 4/1987 |
| JP | 2-126682 | 5/1990 |
| JP | 3-226291 | 10/1991 |

(Continued)

OTHER PUBLICATIONS

International Search Report, issued in International Patent Application No. PCT/JP2006/313575, dated on Oct. 3, 2006.

(Continued)

*Primary Examiner* — Matthew C Landau
*Assistant Examiner* — Fazli Erdem
(74) *Attorney, Agent, or Firm* — McDermott Will & Emery LLP

(57) ABSTRACT

In a semiconductor element (20) including a field effect transistor (90), a schottky electrode (9a) and a plurality of bonding pads (12S, 12G), at least one of the plurality of bonding pads (12S, 12G) is disposed so as to be located above the schottky electrode (9a).

13 Claims, 10 Drawing Sheets

FOREIGN PATENT DOCUMENTS

| | | |
|---|---|---|
| JP | 5-198816 | 8/1993 |
| JP | 05-198816 | 8/1993 |
| JP | 06-120347 | 4/1994 |
| JP | 6-120347 | 4/1994 |
| JP | 7-115193 | 5/1995 |
| JP | 07-115193 | 5/1995 |
| JP | 09-102607 | 4/1997 |
| JP | 10-136641 | 5/1998 |
| JP | 10-136642 | 5/1998 |
| JP | 11-274482 | 10/1999 |
| JP | 2002-203967 | 7/2002 |
| JP | 2002-373989 | 12/2002 |
| JP | 2003-133557 | 5/2003 |
| JP | 2003-526949 | 9/2003 |
| JP | 2004-289103 | 10/2004 |
| JP | 2005-501408 | 1/2005 |
| JP | 2005-101551 | 4/2005 |
| WO | WO 03/010812 A1 | 2/2003 |

OTHER PUBLICATIONS

International Search Report, issued in International Patent Application No. PCT/JP2006/314489, dated on Oct. 24, 2006.
U.S. Appl. No. 11/995,072, filed Jan. 8, 2008.
U.S. Appl. No. 11/996,880, filed Jan. 25, 2008.
European Search Report issued in European Patent Application No. 06781411.1, mailed Apr. 6, 2009.
European Search Report issued in European Patent Application No. 06781438.4, mailed Apr. 6, 2009.
European Search Report issued in European Patent Application No. 06767985.2, mailed Apr. 6, 2009.
Belverde, G., et al., "A Low-Voltage MOSFET with Small on-Resistance: an Extended Characterization in High-Efficiency Power Converter Applications", Conference Record of the 2001 IEEE Industry Applications Conference 36th IAS Annual Meeting, Sep.-Oct. 2001, pp. 635-640, USA.

* cited by examiner

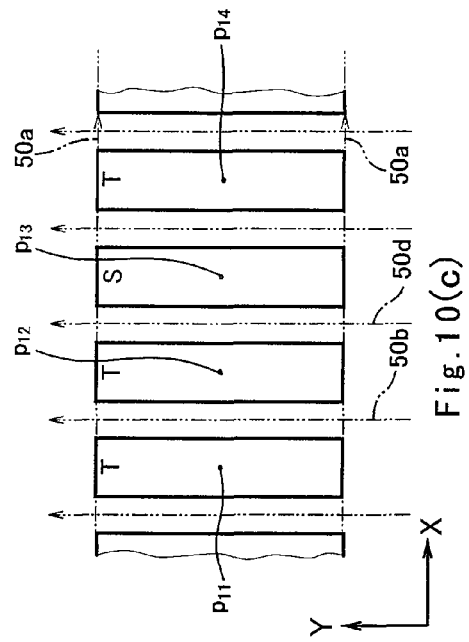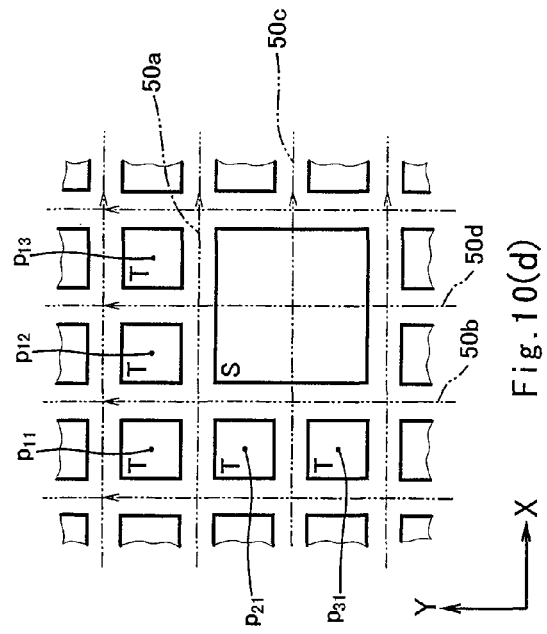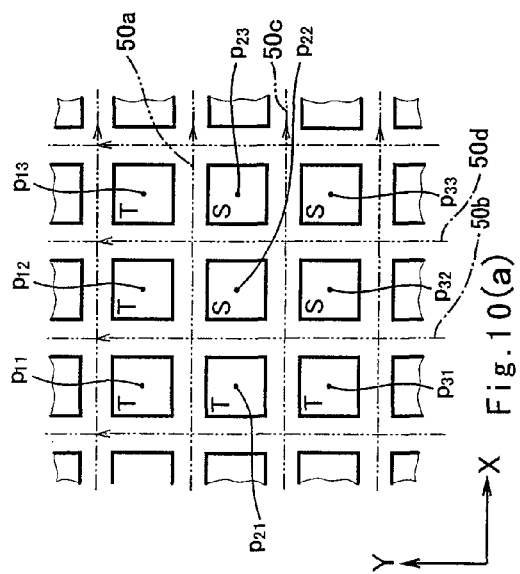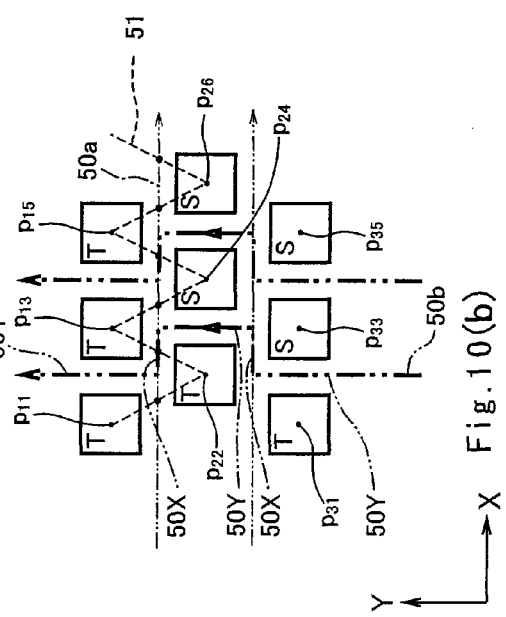

SEMICONDUCTOR ELEMENT AND ELECTRICAL APPARATUS

RELATED APPLICATIONS

This application is the U.S. National Phase under 35 U.S.C. §371 of International Application No. PCT/JP2006/314516 filed on Jul. 21, 2006, which in turn claims the benefit of Japanese Application No. 2005-215752, filed on Jul. 26, 2005, the disclosures of which Applications are incorporated by reference herein.

TECHNICAL FIELD

The present invention relates to a semiconductor element, and particularly to a semiconductor power switching element which controls an inverter circuit, etc.

BACKGROUND ART

One example of a normal semiconductor power switching element is an IGBT (Insulated Gate Bipolar Transistor). One application example of the semiconductor power switching element is a control circuit for use in power electronics control, such as an inverter circuit which controls a three-phase motor.

FIG. 9 is a circuit diagram schematically showing this conventional inverter circuit. As shown in FIG. 9, the conventional inverter circuit (three-phase circuit here) includes circuits (hereinafter referred to as "phase switching circuit") 23 each formed by connecting a switch function portion (hereinafter referred to as "upper arm") 23H and a switch function portion (hereinafter referred to as "lower arm") 23L in series, and the number of circuits corresponds to the number of phases (three here). Each of the upper arm 23H and the lower arm 23L is constituted of a switching element 21 and a diode 22 which are connected in parallel to each other. The switching element 21 is constituted of, for example, the IGBT using silicon. The upper arm 23H is connected to a high potential wiring 25, and the lower arm 23L is connected to an earth potential wiring 24. Midpoints 26 between the arms 23 are connected to input terminals (hereinafter referred to as "motor input terminals") 27 of a three phase AC motor that is a load. The potential of the midpoint 26 can be controlled by adjusting ON-OFF timings of the upper arm 23H and the lower arm 23L. To be specific, the potential of the midpoint 26, that is, the potential of the input terminal 27 becomes equal to the earth potential 24 when the lower arm 23L is ON and the upper arm 23H is OFF. Meanwhile, the potential of the midpoint 26, that is, the potential of the input terminal 27 becomes equal to the high potential 25 when the upper arm 23H is ON and the lower arm 23L is OFF. Thus, the three-phase motor 28 can be controlled by switching the potential of the motor input terminal 27 between the earth potential 24 and the high potential 25.

However, the response speed of the switching element 21 and the response speed of the diode 22 are limited. Therefore, even if a signal for switching from an ON state to an OFF state is supplied to the switching element 21 and the diode 22, the switching element 21 and the diode 22 do not become the OFF state immediately. On this account, in a case where the ON-OFF switching of the upper arm 23H and the ON-OFF switching of the lower arm 23L are carried out at the same time, both the upper arm 23H and the lower arm 23L may become the ON state. Such a state is a state where the high potential 25 and the earth potential 24 are short-circuited, so that a large current flows to the inverter circuit. Moreover, since this current becomes a loss current, the switching loss increases, and the power use efficiency decreases. In the inverter circuit, high efficient inverter control is carried out by high speed switching. Therefore, the switching loss is repeated for the number of switchings. Thus the entire switching loss becomes large. On this account, conventionally, the timing of the switching is determined in consideration of the response speed of the switching element 21 and the response speed of the diode 22. In other words, the frequency of the inverter control is determined in accordance with the limitations of the response speed of the switching element 21 and the response speed of the diode 22. However, in the case of carrying out the high efficient inverter control by further higher speed switching, further increase in speed of the switching of the switching element 21 and the diode 22 is required.

However, in the case of using the IGBT as the switching element, since the IGBT is a bipolar device, the lifetime of the minority carrier is long, and the time required for the reverse recovery is long. Therefore, the switching from ON to OFF is not carried out at high speed. So, a MOSFET (metal-oxide semiconductor field-effect transistor) that is a unipolar device is used as the switching element. Since the unipolar device is not affected by the minority carrier, the switching from ON to OFF can be carried out at high speed. However, in the case of the MOSFET made of silicon, the ON-resistance Ron ($\Omega cm^2$) per unit area is high, and a conduction loss due to heat generation increases.

In contrast, one example of a diode whose switching is increased in speed is a fast recovery diode which is subjected to carrier lifetime control. However, it is difficult for the fast recovery diode to operate at a high frequency of several tens of kHz or more. Moreover, the fast recovery diode is the bipolar device. Therefore, although the ON-resistance decreases due to the diffusion of the minority carriers, the lifetime of the minority carrier is long. On this account, the switching from ON to OFF takes time. One example of a diode whose switching is further increased in speed is a schottky diode in which a schottky electrode is provided so as to form a schottky junction with a semiconductor. Since the schottky diode is the unipolar device and is not affected by the minority carrier, the switching from ON to OFF can be carried out at high speed. However, since the schottky diode made of silicon has the withstand voltage of only about 100 V, it cannot be used in a power electronics field which requires the withstand voltage of 600 V or higher.

Moreover, since the IGBT and diode made of silicon are subjected to the carrier lifetime control, they cannot be integrated in one chip.

Here, proposed is to form the switching element and the diode, used in the inverter circuit, etc., by wide band-gap semiconductors.

For example, regarding the diode, the schottky diode made of the wide band-gap semiconductor has the withstand voltage of 600 V or higher, has the ON-resistance which is adequately lower than that of the diode made of silicon, and can carry out the switching from ON to OFF at high speed.

Also, regarding the switching element, the MOSFET made of the wide band-gap semiconductor has the ON-resistance per unit area which is adequately lower than that of the IGBT made of silicon, can secure the withstand voltage, and can carry out the switching from ON to OFF at high speed.

However, even in the case of a SiC-MISFET, by a parasitic diode constituted of a PN junction of a p-type region and an n-type region in a semiconductor device, a reverse recovery time delay may occur in the case of switching from an ON state of the parasitic diode to an OFF state of the SiC-MISFET when a reverse bias is applied.

For example, when a positive voltage that is a counter electromotive voltage generated by an inductance load when the switching element is turned OFF is applied to a source electrode, positive holes as minority carriers are implanted in the n-type region via the parasitic diode, and this causes the reverse recovery time delay of the operation of the parasitic diode.

Meanwhile, the schottky diode and the MOSFET that is the switching element can be integrated in one chip in such a manner that the MOSFET is made of the wide band-gap semiconductor, and the schottky electrode is disposed so as to form a schottky junction with a drift region of the vertical MOSFET (see Patent Document 1).

Patent Document 1: Japanese Laid-Open Patent Application Publication 2002-203967

DISCLOSURE OF THE INVENTION

Problems to be Solved by the Invention

In the case of using the above conventional semiconductor element as the switching element constituting a specific inverter power source circuit (for example, an inverter power source circuit for a three-phase motor of an air-conditioner compressor or the like), there are the following problems for the practical application of such switching element.

The installation area of a metal electrode (schottky electrode) of the schottky junction does not cause harmful effects on the high speed switching operation of the semiconductor element. However, considering that the forward voltage is applied to the parasitic diode in the MOSFET and the schottky diode, and the current is applied to these diodes, the installation area of the metal electrode is an important matter which should be considered in light of securing of an appropriate conduction ability.

In fact, the technology described in Patent Document 1 was applied to the inverter power source circuit for the three-phase motor. Discovered here was a possibility that the switching element breaks down due to the current which concentrates on the schottky electrode because of the counter electromotive voltage, as a trigger, generated based on the inductance load when the switching element is turned OFF.

Moreover, the schottky electrodes shown in FIG. 2 of Patent Document 1 are arranged in an orthogonal lattice manner in plan view so as to surround a field effect transistor region and be connected to a micro wiring. On this account, during fabrication of the semiconductor elements, the micro wiring tends to break, and this may become a factor for deteriorating fabrication yield of the semiconductor elements.

The present invention was made in view of these circumstances, and an object of the present invention is to provide a semiconductor element and an electrical apparatus each of which can realize both high-speed switching operation and energy loss reduction, excels in resistance to current concentration based on the counter electromotive voltage generated by, for example, the inductance load of the electrical apparatus, and can suppress the deterioration of an insulating layer of the field effect transistor at the time of wire bonding.

Means for Solving the Problems

As a result of diligent studies to solve the above problems, the present inventors have found that in the construction of Patent Document 1, since a ratio of an area of a region where the schottky electrode is disposed to an area of an entire semiconductor element is low, the current concentrates on the schottky electrode, so that the semiconductor element breaks down.

Moreover, in the case of bonding the semiconductor element which switches a large current by a high voltage, a thick wiring having a diameter of 0.3 mm or more is subjected to wire bonding and connected to an electrode terminal, etc. so as to withstand the large current. In this case, the wiring is bonded to the bonding pad, disposed on the semiconductor element, by pressing the wiring against the bonding pad while applying ultrasound. If the field effect transistor is disposed below the bonding pad, the application of the ultrasound may break the field effect transistor. The present inventors have found that the application of the ultrasound deteriorates the withstand voltage of an insulating film in the field effect transistor.

So, a semiconductor element of the present invention comprises a field effect transistor including: a semiconductor layer; a first source/drain region which is a first conductivity type and formed in the semiconductor layer so as to include an upper surface of the semiconductor layer; a second conductivity type region which is a second conductivity type and formed in the semiconductor layer so as to include the upper surface and the first source/drain region; a drift region which is a first conductivity type and formed in the semiconductor layer so as to include the upper surface and the second conductivity type region; a first source/drain electrode which is formed so as to contact at least the upper surface of the first source/drain region; a gate electrode which is formed so as to face at least the upper surface of the second conductivity type region with a gate insulating film provided between the gate electrode and the second conductivity type region; and a second source/drain electrode which is connected to the drift region in an ohmic manner, a schottky electrode which is disposed on the upper surface of the drift region so as to form a schottky junction with the upper surface of the drift region, an interlayer insulating film which covers the upper surface of the semiconductor layer on which the first source/drain electrode, the gate electrode and the schottky electrode are disposed, and a plurality of bonding pads which are disposed on the interlayer insulating film and each of which is electrically connected to at least one of the first source/drain electrode, the gate electrode and the schottky electrode, wherein: the semiconductor layer is divided into a plurality of cells by a virtual border line in plan view; the drift region and the second source/drain electrode are formed so as to extend over the plurality of cells; the plurality of cells are constituted of transistor cells in each of which the field effect transistor is formed and diode cells in each of which the schottky electrode is formed; and the bonding pad is located above the schottky electrode of the diode cell.

With this configuration, even if the wiring is bonded to the bonding pad by pressing the wiring against the bonding pad while applying ultrasound, it is possible to suppress the breakdown of the field effect transistor formed in the transistor cell and the deterioration of the withstand voltage of the gate insulating film, since the diode cell in which the schottky electrode is formed is disposed below the bonding pad. Moreover, the schottky junction having an energy barrier smaller than a p/n barrier existing in the field effect transistor exists in the semiconductor element. Therefore, when the surge voltage is applied to the semiconductor element, a leakage current preferentially flows to the schottky junction portion. This relaxes the surge voltage and suppresses the breakdown of the semiconductor element. Moreover, when the parasitic diode of the field effect transistor switches from ON to OFF, the minority carriers derived from the parasitic diode of the field effect transistor are absorbed by the schottky electrode, so that it becomes possible to carry out high-speed switching.

With this configuration, even if the wiring is bonded to the bonding pad by pressing the wiring against the bonding pad while applying ultrasound, it is possible to suppress the breakdown of the field effect transistor formed in the transistor cell and the deterioration of the withstand voltage of the gate insulating film, since the diode cell in which the schottky electrode is formed is disposed below the bonding pad. Moreover, the schottky junction having an energy barrier smaller than a p/n barrier existing in the field effect transistor exists in the semiconductor element. Therefore, when the surge voltage is applied to the semiconductor element, a leakage current preferentially flows to the schottky junction portion. This relaxes the surge voltage and suppresses the breakdown of the semiconductor element. Moreover, when the parasitic diode of the field effect transistor switches from ON to OFF, the minority carriers derived from the parasitic diode of the field effect transistor are absorbed by the schottky electrode, so that it becomes possible to carry out high-speed switching.

With this configuration, since the area of a region where the schottky electrode is disposed can be sufficiently made large, the current concentration on the schottky electrode is prevented, and the breakdown of the semiconductor element is suppressed.

The first source/drain electrode may be disposed so as to contact the first source/drain region and the upper surface of the second conductivity type region.

The first conductivity type may be an n type, and the second conductivity type may be a p type.

The semiconductor layer may be made of a wide band-gap semiconductor.

The semiconductor layer may be divided into a plurality of cells by a virtual border line in plan view; the drift region and a drain electrode may be formed so as to extend over the plurality of cells; the plurality of cells may be constituted of a transistor cell in which the field effect transistor is formed and a diode cell in which the schottky electrode is formed; and the bonding pad may be located above the schottky electrode of the diode cell.

With this configuration, since the area of a region where the schottky electrode is disposed can be sufficiently made large, the current concentration on the schottky electrode is prevented, and the breakdown of the semiconductor element is suppressed.

In plan view, one or more diode cells may be disposed like an island among a plurality of the transistor cells, and the bonding pads may be located above the above-described one or more diode cells, respectively, disposed like an island.

The plurality of bonding pads may be connected to each other by a wiring.

The bonding pad may have a square shape whose one side is 0.3 mm or more.

It is preferable that a ratio of an area of all the transistor cells in plan view to an area of the semiconductor element in plan view be not less than 50% and not more than 99%.

It is preferable that a ratio of an area of the schottky electrode to an area of the semiconductor element in plan view be not less than 1% and not more than 50%.

It is preferable that an area of the schottky electrode in the diode cell be larger than an area of the second conductivity type region in the transistor cell in plan view.

Moreover, the present invention can be used as a semiconductor element constituting an inverter power source circuit of an AC driving device. For example, the present invention is applicable to an electrical apparatus in which the semiconductor element is incorporated as an arm module.

In accordance with the electrical apparatus thus constructed, the conduction loss of the semiconductor element corresponds to a value obtained by multiplying the current by the voltage (current×voltage). Therefore, since the forward voltage of the schottky diode can be kept lower than the forward voltage of the conventional PN junction diode, the conduction loss of the semiconductor element incorporated as the arm module in the inverter power source circuit of the electrical apparatus is improved compared to the existing semiconductor element adopting the PN junction diode.

Furthermore, the switching speed from the ON state to the OFF state of the semiconductor element incorporated as the arm module in the inverter power source circuit of the electrical apparatus increases, and the switching loss is reduced.

A voltage applied to a parasitic diode of the field effect transistor and a schottky diode, which is constituted of the drift region and the schottky electrode forming the schottky junction with the upper surface of the drift region, based on a counter electromotive voltage generated by an inductance load in the AC driving device may be higher than a forward rising voltage of the schottky diode and lower than a forward rising voltage of the parasitic diode.

One example of the AC driving device is an AC motor driven by the inverter power source circuit, and the AC motor drives, for example, a compressor of an air conditioner.

The above object, other objects, features, and advantages of the present invention will be made clear by the following detailed explanation of preferred embodiments with reference to the attached drawings.

EFFECTS OF THE INVENTION

The present invention can provide a semiconductor element and an electrical apparatus each of which can realize both high-speed switching operation and energy loss reduction, excels in resistance to current concentration based on the counter electromotive voltage generated by, for example, the inductance load of the electrical apparatus, and can suppress the deterioration of the insulating film of the field effect transistor at the time of wire bonding.

BRIEF DESCRIPTION OF THE DRAWINGS

FIG. 10 are schematic diagrams for explaining virtual border lines. FIG. 10(*a*) is a diagram showing a first method for specifying the virtual border lines. FIG. 10(*b*) is a diagram showing a second method for specifying the virtual border lines. FIG. 10(*c*) is a diagram showing a third method for specifying the virtual border lines. FIG. 10(*d*) is a diagram showing a fourth method for specifying the virtual border lines.

Figure 1:
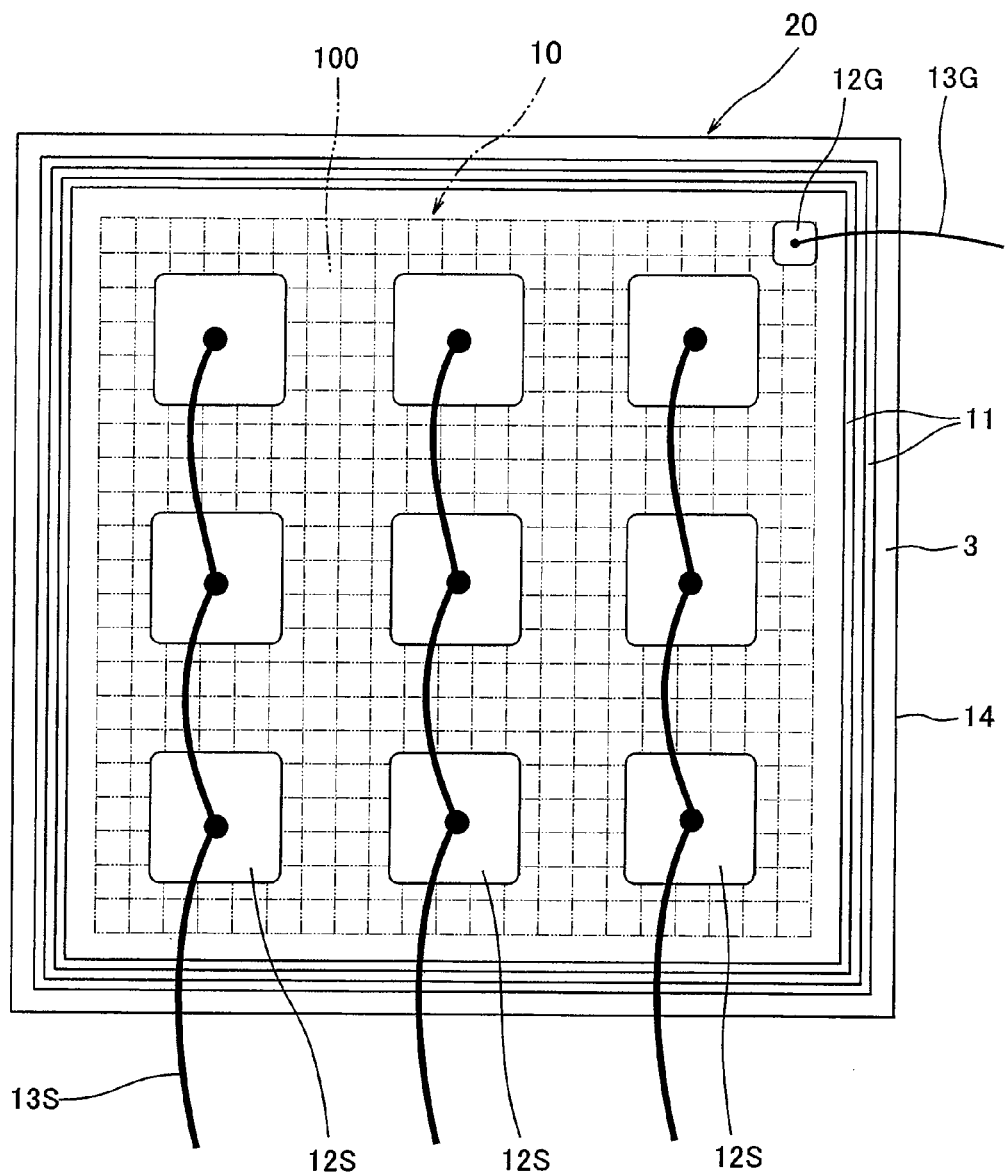
FIG. 1 is a plan view showing the construction of a semiconductor element of Embodiment 1 of the present invention.

EXPLANATION OF REFERENCE NUMBERS 1 drain electrode
2 semiconductor substrate
3 semiconductor layer (SiC layer)
3*a* drift region
4 p-type semiconductor region (second conductivity type region)
4*a* p-type semiconductor region outer peripheral portion
4*b* p-type semiconductor region center portion
5 source region
6 source electrode
7 gate insulating film
8 gate electrode
9 diode forming region
9*a*, 9*b* schottky electrode
10 transistor forming region
11 guard ring (withstand voltage member)
12S source schottky pad
12G gate pad
13S, 13G wiring
14 semiconductor element end portion
15 drain electrode terminal
16 source electrode terminal
17 gate electrode terminal
18 sealing resin
20 semiconductor element
21 switching element
22 diode
23 phase switching circuit
23H upper arm
23L lower arm
24 earth potential wiring (earth potential)
25 high potential wiring (high potential)
26 arm midpoint
27 motor input terminal
28 three-phase motor
40 interlayer insulating film
50 virtual border line
50*a*, 50*c* horizontal border line
50*b*, 50*d* vertical border line
50X portion virtual line
50Y Y portion virtual line
51 zigzag line
70 schottky diode
80 diode cell
90 field effect transistor (MOSFET)
100 transistor cell
200 cell

BEST MODE FOR CARRYING OUT THE INVENTION

Hereinafter, embodiments of the present invention will be explained with reference to the drawings.

Embodiment 1

Figure 2:
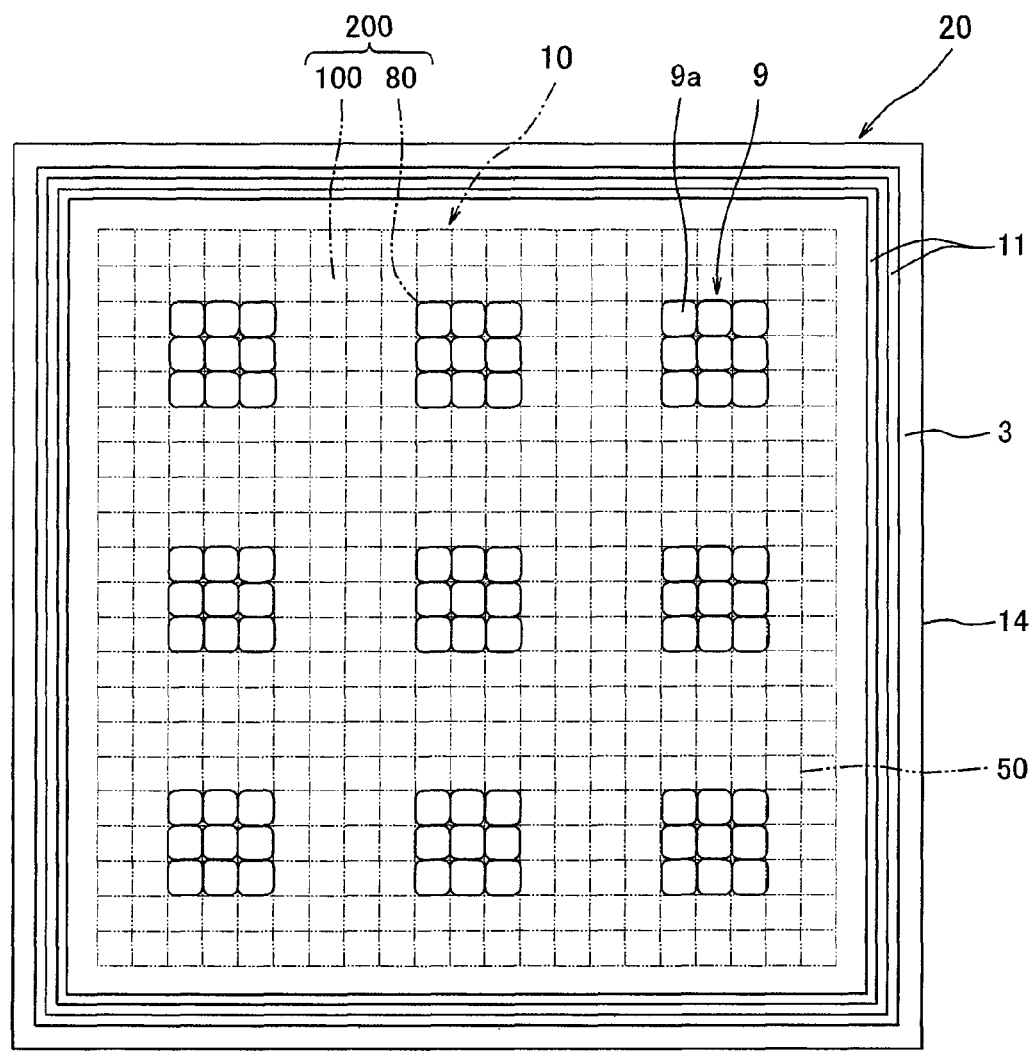
FIG. 2 is a plan view showing the construction of the semiconductor element of Embodiment 1 of the present invention.
Figure 3:
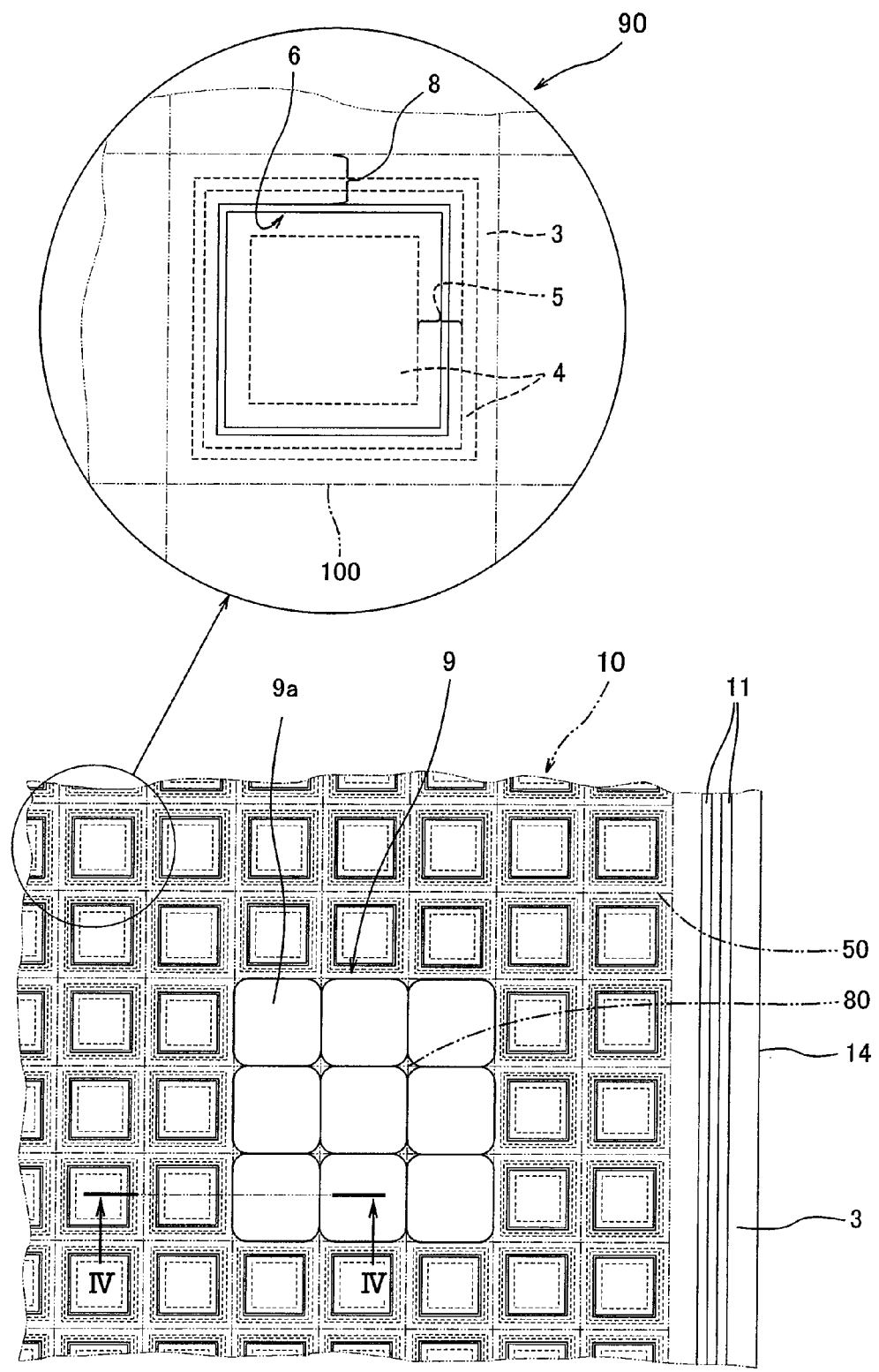
FIG. 3 is a partial plan view enlarging part of the construction of the semiconductor element of FIG. 1.
Figure 4:
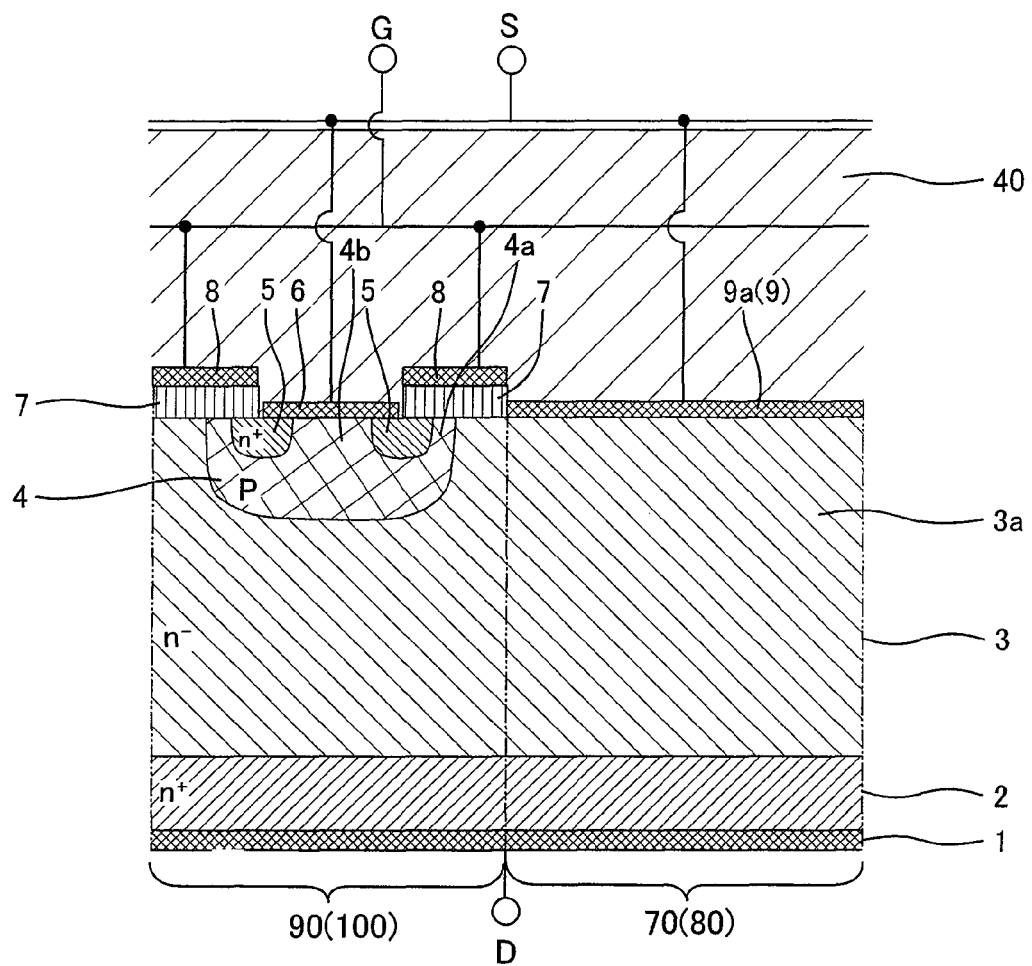
FIG. 4 is a partial cross-sectional view showing the construction of the semiconductor element of FIG. 1 in cross section, and is a cross-sectional view taken along line IV-IV of FIG. 3.

FIGS. 1 and 2 are plan views each showing the construction of a semiconductor element of Embodiment 1 of the present invention. FIG. 3 is a partial plan view enlarging part of the construction of the semiconductor element of FIG. 1. FIG. 4 is a partial cross-sectional view showing the construction of the semiconductor element of FIG. 1 in cross section, and is a cross-sectional view taken along line IV-IV of FIG. 3.

A semiconductor element of the present embodiment functions as a circuit in which a field effect transistor (hereinafter may be referred to as "MOSFET") and a schottky diode are connected in parallel to each other, and is constituted of one IC chip in which a plurality of field effect transistors and a plurality of schottky diodes constituting the above circuit are integrated. For example, the semiconductor element of the present embodiment is used as a phase switching circuit 23 in an inverter circuit (see FIG. 6) for driving a three-phase motor. The number of field effect transistors integrated is determined depending on a desired current capacity.

As shown in FIGS. 1 and 2, a semiconductor element 20 of the present embodiment includes a transistor forming region 10. Herein, the transistor forming region 10 is square in plan view. However, the shape of the cell forming region 201 in plan view is not limited to be square. The transistor forming region 10 is divided into a plurality of cells 200 sectioned by lattice-like virtual border lines 50 in plan view, in other words, a plurality of cells 200 constituted of regions arranged in rows and columns. Herein, each cell 200 is square. The plurality of cells 200 are constituted of transistor cells 100 in each of which a field effect transistor 90, will be described later, is formed and diode cells 80 in each of which a schottky electrode 9*a* is provided and a schottky diode 70 is formed. In the transistor forming region 10 of the semiconductor element 20 of the present embodiment, regions (hereinafter referred to as "diode forming regions") 9 in each of which one or more diode cells 80 are formed are formed like an island, and the transistor cells 100 are formed so as to fill regions between the diode forming regions 9 formed like an island. In the present embodiment, nine diode forming regions 9 are formed in the transistor forming region 10, however the number of diode forming regions 9 is not limited to this. Moreover, in the present embodiment, one diode forming region 9 is constituted of nine diode cells 80 of three in column×three in row, however the number and arrangement of the diode cells 80 are not limited to these.

A guard ring 11 is formed outside the transistor forming region 10 and on the surface of the semiconductor layer 3, will be described later, so as to surround the transistor forming region 10. Bonding pads (source schottky pads) 12S are disposed so as to cover the diode forming regions 9. Note that the area of the source schottky pad 12S may be smaller than the area of the diode forming region 9. The source schottky pads 12S are connected to each other by a wiring 13S so as to be bridged. Moreover, a bonding pad (gate pad) 12G is disposed at an outer peripheral end portion of the transistor forming region 10, and the gate pad 12G is connected by a wiring 13G.

Next, the virtual border lines 50 will be explained. FIG. 10 are schematic diagrams for explaining the virtual border lines. FIG. 10(a) is a diagram showing a first method for specifying the virtual border lines. FIG. 10(b) is a diagram showing a second method for specifying the virtual border lines. FIG. 10(c) is a diagram showing a third method for specifying the virtual border lines. FIG. 10(d) is a diagram showing a fourth method for specifying the virtual border lines.

The virtual border line 50 shown by a chain double-dashed line in FIGS. 1 to 3 is shown for ease of explanation of Claims and Description, and does not actually formed in a product obtained by embodying the present invention. In a case where the transistor cells 100 are adjacent to each other, the virtual border line 50 is a virtual line extending in a vertical direction or a horizontal direction so as to be located equidistant from the centers of these transistor cells 100. In a case where the diode cells 80 are adjacent to each other, the virtual border line 50 is a virtual line extending in a vertical direction or a horizontal direction so as to be located equidistant from the centers of these diode cells 80. In a case where the transistor cell 100 and the diode cell 80 are adjacent to each other, the virtual border line 50 is a virtual line extending in a vertical direction or a horizontal direction so as to be located equidistant from the center of this transistor cell 100 and the center of this diode cell 80. The virtual border line 50 is suitably changed depending on the shape of the field effect transistor 90 and the shape of the schottky diode 70.

As shown in FIG. 10, various arrangement patterns can be assumed as actual arrangements of the field effect transistors 90 and the schottky diodes 70. Therefore, the methods for specifying the virtual border lines 50 which methods correspond to the respective arrangement patterns will be explained with reference to FIG. 10. In the following explanation, horizontal border lines 50a and 50c and vertical border lines 50b and 50d are separately explained as the virtual border line 50. For the purpose of simplification of the following explanation, in FIG. 10, the field effect transistor 90 is abbreviated as an element "T", and the schottky diode 70 is abbreviated as an element "S". In addition, for the sake of convenience of explanation, a direction in which the horizontal border line 50a, 50c extends is referred to as an "X direction", and a direction in which the vertical border line 50b, 50d extends is referred to as a "Y direction". Further, an arrangement of the elements S and T lined up in the X direction is referred to as a row direction arrangement, and an arrangement of the elements S and T lined up in the Y direction is referred to as a column direction arrangement.

First, the first method for specifying the virtual border line 50 will be explained with reference to FIG. 10(a).

FIG. 10(a) exemplifies the elements T and S arranged in a matrix manner of 3 rows and 3 columns. The elements T are arranged so as to surround a region where the elements S are arranged. FIG. 10(a) shows an example in which each of the elements T and the elements S is formed so as to have a square shape. Thus, for ease of explanation, the shape of the schottky electrode 9a is simplified as a square shape.

However, such shapes and arrangement of the elements T and the elements S are just set for the purpose of explaining a method for specifying the virtual border line 50. Therefore, for example, the specific shape of each of the elements T and the elements S does not have to be square, and may be circular, triangular, or polygonal, such as pentagonal or more, as long as its center is determined properly.

However, in a case where the element T and the element S are significantly different in shape from each other, such as in a case where the element T is square and the element S is triangular, modification based on a suitable correction coefficient may be necessary when calculating a ratio of an area of the transistor cells 100 or the diode cells 80 to the entire area of the semiconductor element 20.

As shown in FIG. 10(a), since each of the elements T and S disposed on respective portions of 3 rows and 3 columns is square, a center $P_{ij}$ (i=1 to 3, j=1 to 3) of each element is uniquely determined as an intersection point of diagonal lines of the square.

The horizontal border line 50a is formed so as to be located equidistant from centers ($P_{11}$ and $P_{21}$) of a pair of elements T adjacent to each other in a column direction and to be located equidistant from centers ($P_{12}$ and $P_{22}$ for example) of the elements T and S adjacent to each other in the column direction. Moreover, a horizontal border line 50c is formed so as to be located equidistant from centers ($P_{21}$ and $P_{31}$) of a pair of elements T adjacent to each other in the column direction and to be located equidistant from centers ($P_{22}$ and $P_{32}$ for example) of a pair of elements S adjacent to each other in the column direction.

The vertical border line 50b is formed so as to be located equidistant from centers ($P_{11}$ and $P_{12}$) of a pair of elements T adjacent to each other in the row direction and to be located equidistant from centers ($P_{21}$ and $P_{22}$ for example) of the elements T and S adjacent to each other in the row direction. Moreover, the vertical border line 50d is formed so as to be located equidistant from centers ($P_{12}$ and $P_{13}$) of a pair of elements T adjacent to each other in the row direction and to be located equidistant from centers ($P_{22}$ and $P_{23}$ for example) of a pair of elements S adjacent to each other in the row direction.

Next, the second method for specifying the virtual border line 50 will be explained with reference to FIG. 10(b).

FIG. 10(b) exemplifies the square elements T and S arranged in a staggered manner (zigzag alignment). The elements T are formed so as to surround a region where the elements S are arranged. The elements T and S constituting the second row arrangement shift in the X direction by half a pitch of the elements T and S constituting the first row arrangement or the third row arrangement relative to the elements T and S constituting the first row arrangement or the third row arrangement. Therefore, the arrangement pattern of the elements T and S has 3 rows and 6 columns. Thus, some of respective portions of 3 rows and 6 columns are not provided with the element T or the element S (for example, no element is provided in a portion defined by the second row and the third column).

Since each of the elements T and S existing in appropriate portions of respective portions of 3 rows and 6 columns is square, a center $P_{ij}$ (i=1 to 3, j=1 to 6, except for $P_{12}$, $P_{14}$, $P_{16}$, $P_{21}$, $P_{23}$, $P_{25}$, $P_{32}$, $P_{34}$ and $P_{36}$) of each of the elements T and S is uniquely determined as an intersection point of diagonal lines of the square.

The horizontal border line 50a (shown by a thin chain double-dashed line in FIG. 10(b)) is a virtual line extending in the X direction so as to pass through a midpoint (The midpoint is shown by a black dot shown in FIG. 10(b). The same is true in the following explanation.) on a zigzag line 51 extending between the center $P_{11}$ of the element T defined by the first row and the first column and the center $P_{22}$ of the element T defined by the second row and the second column which elements are adjacent to each other in an oblique direction, a midpoint on the zigzag line 51 extending between the center $P_{22}$ of the element T defined by the second row and the second column and the center $P_{13}$ of the element T defined by the first row and the third column which elements are adjacent to each other in the oblique direction, a midpoint on the zigzag line 51 extending between the center $P_{13}$ of the element T defined by the first row and the third column and the center $P_{24}$ of the element S defined by the second row and the fourth column which elements are adjacent to each other in the oblique direction, a midpoint on the zigzag line 51 extending between the center $P_{24}$ of the element S defined by the second row and the fourth column and the center $P_{15}$ of the element T defined by the first row and the fifth column which elements are adjacent to each other in the oblique direction, and a midpoint on the zigzag line 51 extending between the center $P_{15}$ of the element T defined by the first row and the fifth column and the center $P_{26}$ of the element S defined by the second row and the sixth column which elements are adjacent to each other in the oblique direction.

The vertical border line 50*b* (shown by a thick chain double-dashed line in FIG. 10(*b*)) is a virtual line constituted of: a Y portion virtual line 50Y extending in the Y direction so as to be located equidistant from the centers ($P_{11}$ and $P_{13}$) of a pair of elements T adjacent to each other in the row direction; the Y portion virtual line 50Y extending in the Y direction so as to be located equidistant from the center $P_{22}$ of the element T and the center $P_{24}$ of the element S which elements are adjacent to each other in the row direction; the Y portion virtual line 50Y extending in the Y direction so as to be located equidistant from the center $P_{31}$ of the element T and the center $P_{33}$ of the element S which elements are adjacent to each other in the row direction; and two X portion virtual lines 50X extending in the X direction so as to connect ends of these three Y portion virtual lines 50Y.

Next, the third method for specifying the virtual border line 50 will be explained with reference to FIG. 10(*c*).

FIG. 10(*c*) exemplifies three rectangular elements T arranged in the X direction and one rectangular element S disposed (in the third column) between a pair of elements T among the above three elements T. The elements T and S are formed so as to be in the shape of stripes each seamlessly extending in the Y direction.

Since each of the elements T and the element S is rectangular, a center $P_{ij}$ (i=1, j=1 to 4) of each of these elements is uniquely determined as an intersection point of diagonal lines of the rectangle.

The vertical border line 50*b* is a virtual line extending in the Y direction so as to be located equidistant from the centers $P_{11}$ and $P_{12}$ of the elements T adjacent to each other in the row direction. Moreover, the vertical border line 50*d* is a virtual line extending in the Y direction so as to be located equidistant from the center $P_{12}$ of the element T and the center $P_{13}$ of the element S which elements are adjacent to each other in the row direction.

In FIG. 10(*c*), the element T and the element S are not adjacent to each other in the column direction. Therefore, selected as the horizontal border lines 50*a* are such a pair of virtual lines that a Y-direction distance between one of the virtual lines and the center of each of four elements adjacent to each other in the row direction is equal to a Y-direction distance between the other one of the virtual lines and the center of each of four elements adjacent to each other in the row direction. As an example of such virtual lines, a pair of horizontal border lines 50*a* are shown, one of which passes through one end surface of each of the elements T and S, and the other one of which passes through the other end surface of each of the elements T and S.

Next, the fourth method for specifying the virtual border line 50 will be explained with reference to FIG. 10(*d*).

FIG. 10(*d*) exemplifies the square elements T arranged in a matrix manner and the element S surrounded by a region where the elements T are arranged. One element S is formed so as to have a substantially square shape constituted of four cells 200. The arrangement pattern of the elements T and the element S shown in FIG. 10(*d*) is the same as the arrangement of the elements T and the elements S shown in FIG. 10(*a*) except that the element S is formed so as to extend over a plurality of cells 200 and to intersect with the horizontal border line 50*c* and the vertical border line 50*d*. Therefore, explanations of the virtual border lines 50 other than the horizontal border line 50*c* intersecting with the element S and the vertical border line 50*d* intersecting with the element S are omitted here.

As shown in FIG. 10(*d*), the horizontal border line 50*c* intersecting with the element S is an extended line of a virtual line extending in the row direction so as to be located equidistant from the centers ($P_{21}$ and $P_{31}$) of the elements T adjacent to each other in the column direction. Moreover, the vertical border line 50*d* intersecting with the element S is an extended line of a virtual line extending in the column direction so as to be located equidistant from the centers ($P_{12}$ and $P_{13}$) of the elements T adjacent to each other in the row direction.

Next, the construction of the semiconductor element 20 adopting a planar type will be explained in detail.

As shown in FIG. 4, the semiconductor element 20 includes a semiconductor substrate 2. The semiconductor substrate 2 is made of SiC, and is doped as $n^+$-type (n-type of a high impurity concentration). A drain electrode (second source/drain electrode) 1 is formed on an entire lower surface of the semiconductor substrate 2. The drain electrode 1 is made of a conductive material, for example, a metal, such as Ni, Al, Ti or Mo. Moreover, a semiconductor layer 3 is formed on an entire upper surface of the semiconductor substrate 2. Although the semiconductor substrate 2 and the semiconductor layer 3 are made of silicon carbide (SiC), they may be made of the other wide band-gap semiconductor. Specifically, group III nitride, such as GaN and AlN, diamond, etc. may be used. Here, the wide band-gap semiconductor is a semiconductor having 2.0 eV or more of an energy band gap that is an energy difference between a lower end of a conduction band and an upper end of a valence band. The semiconductor layer 3 and the semiconductor substrate 2 constitute a semiconductor of the semiconductor element 20, and the semiconductor is divided into a plurality of cells 200 described above.

In the transistor cell 100 of the semiconductor layer 3, an $n^+$-type source region (first source/drain region) 5 is formed so as to include an upper surface of the semiconductor layer 3. The source region 5 is formed so as to be square and annular in plan view and is formed such that a center thereof substantially coincides with the center of the transistor cell 100. In the semiconductor layer 3, a p-type semiconductor region (second conductivity type region) 4 is formed so as to include the upper surface of the semiconductor layer 3 and the source region 5. Specifically, in the semiconductor layer 3, the p-type semiconductor region 4 is formed so as to include an upper surface portion inside the source region 5 and an upper surface square annular portion surrounding the source region 5 and to extend lower than the lower end of the source region 5. A region of the semiconductor layer 3 other than the source region 5 and the p-type semiconductor region 4 is constituted of an $n^-$-type (n-type of a low impurity concentration) drift region 3*a*. Therefore, the drain electrode 1 is connected to the drift region 3*a* in an ohmic manner with the $n^+$-type semiconductor substrate 2 disposed therebetween. In the transistor cell 100, a gate insulating film 7 is formed so as to cover a portion of the upper surface of the semiconductor layer 3 which portion extends from the midpoint of the source region 5 to the outer periphery of the transistor cell 100. In other words, the gate insulating film 7 is formed on the outer peripheral portion of the source region 5, a portion (hereinafter referred to as a "p-type semiconductor region outer peripheral portion") 4a of the p-type semiconductor region 4 between the source region 5 and the drift region 3a, and a portion of the drift region 3a adjacent to the p-type semiconductor region outer peripheral portion 4a. The gate insulating film 7 is constituted of an oxide film ($SiO_2$). A gate electrode 8 is formed on the gate insulating film 7 so as to completely overlap the gate insulating film 7. Therefore, the p-type semiconductor region outer peripheral portion 4a forms a channel region. The gate electrode 8 is made of a conductive material, for example, a metal such as Ni, Ti, Al or Mo, polysilicon or the like. In the transistor cell 100, a source electrode (first source/drain electrode) 6 is formed on a portion of the upper surface of the semiconductor layer 3 which portion extends from the midpoint of the source region 5 toward the inner side. In other words, the source electrode 6 is formed on the inner peripheral portion of the source region 5 and a portion (hereinafter referred to as a "p-type semiconductor region center portion") 4b of the p-type semiconductor region 4 which portion is located inside the source region 5. The source electrode 6 is connected to the semiconductor layer 3 in an ohmic manner with the $n^+$-type source region 5 and the p-type semiconductor region 4 disposed therebetween. The source electrode 6 is made of a conductive material, for example, a metal such as Ni, Ti, Al or Mo.

In contrast, a schottky electrode 9a is formed on a substantially entire upper surface of the diode cell 80 of the semiconductor layer 3 such that a slight gap is formed between the schottky electrode 9a and the outer periphery of the diode cell 80. In the diode cell 80, the entire region of the semiconductor layer 3 is constituted of the $n^-$-type drift region 3a. Therefore, the schottky electrode 9a forms a schottky junction with the semiconductor layer 3. To prevent the breakdown due to the concentration of the electric field, it is preferable that the schottky electrode 9a be shaped such that corner portions thereof are rounded, as shown in FIGS. 2 and 3. The schottky electrode 9a is made of a conductive material, for example, a metal, such as Ni, Ti, Al or Mo.

The area of the schottky electrode 9a is preferably larger than the area of the p-type semiconductor region 4 in plan view. This is because the following effect becomes more significant with this construction; since a schottky barrier between the schottky electrode 9a and the drift region 3a is smaller than a p/n junction barrier between the p-type semiconductor region 4 and the drift region 3a, a surge voltage is relaxed by the schottky electrode 9a when the surge voltage is applied to the semiconductor element 20.

With this construction, one n channel type vertical field effect transistor 90 is formed in the transistor cell 100, and one schottky diode 70 is formed in the diode cell 80. Moreover, the drift region 3a, the semiconductor substrate 2 and the drain electrode 1 are formed so as to extend over all the cells 200. Moreover, since the gate insulating layer 7 and the gate electrode 8 are continuously formed between the adjacent transistor cells 100, and the diode cells 80 are formed like an island among a large number of transistor cells, one lattice-like gate insulating layer 7 and one lattice-like gate electrode 8 are formed on the entire surface of the semiconductor layer 3, and the source electrode 6 or the schottky electrode 9a is formed in the opening of the lattice-like gate insulating layer 7.

As shown in FIGS. 1 and 2, guard rings 11 are further formed on the upper surface of the semiconductor layer 3. Two guard rings 11 are formed between the transistor forming region 10 and an end (chip end) 14 of the semiconductor layer 3 so as to be square and annular in plan view. The shape of the guard ring 11 in plan view is not limited to square and annular, and may be any shape as long as the guard ring 11 surrounds the outer periphery of the cell forming region 201. Moreover, the number of guard ring 11 is not limited to two, and may be one or three or more. The guard ring 11 is constituted of a p-type semiconductor region whose conduction type is opposite the drift region 3a.

An interlayer insulating film 40 is disposed so as to cover the surface of the semiconductor layer 3 on which the source electrode 6, the gate electrode 8 and the schottky electrode 9a are formed. On an upper surface of the interlayer insulating film 40, source schottky pads 12S are disposed so as to be located above the diode forming region 9. The source schottky pad 12S is made of a metal, such as Al. Herein, the source schottky pad 12S has a square shape whose one side is 0.6 mm or more. Note that the shape of the source schottky pad 12S is not limited to the square. Nine source schottky pads 12S of three rows×three columns are disposed on the transistor forming region 10 in plan view. The source schottky pad 12S is electrically connected to the source electrode 6 and the schottky electrode 9a. Moreover, one gate pad 12G electrically connected to the gate electrode 8 is disposed at the outer peripheral end portion of the transistor forming region 10 in plan view. Plugs (not shown) made of a plurality of conductors are disposed on the interlayer insulating film 40 so as to penetrate through the interlayer insulating film 40 and to be connected to the gate electrode 8, the source electrode 6 or the schottky electrode 9a. Moreover, wirings (not shown) are disposed on the upper surface of the interlayer insulating film 40 so as to connect the plugs with their corresponding bonding pads. Therefore, the source schottky pad 12S and the source electrode 6 are connected to each other by the corresponding plug and wiring (source wiring), the source schottky pad 12S and the schottky electrode 9a are connected to each other by the corresponding plug and wiring (schottky wiring), and the gate pad 12G and the gate electrode 8 are connected to each other by the corresponding plug and wiring (gate wiring). In the semiconductor element 20 of the present embodiment, nine source schottky pads 12S are disposed, however the number of source schottky pads 12S is not limited to this. The field effect transistors 90, the number of which is equal to the number of transistor cells 100, are connected in parallel to all the source schottky pads 12S, and the schottky electrode 9a, the number of which is equal to the number of diode cells 80, are connected in parallel to all the source schottky pads 12S. Moreover, in the semiconductor element 20 of the present embodiment, one gate pad 12G is disposed, however the number of gate pad 12G is not limited to this. To be specific, it is possible to dispose a plurality of gate pads 12G. In such a case, as with a case of the source schottky pad 12S, a plurality of gate pads 12G are connected to each other by a wiring 13G so as to be bridged each other.

Three source schottky pads 12S lined up in one direction are connected to each other by a wiring 13S so as to be bridged each other. The wiring 13S is made of a metal, such as Al or Au. The source schottky pad 12S and the wiring 13S are connected to each other by pressing the wiring 13S against the source schottky pad 12S while applying ultrasound. In the semiconductor element 20 of the present embodiment, a wiring having a diameter of 0.3 mm is used as the wiring 13S. However, it is preferable that a wiring having a diameter of 0.3 mm or more be used so as to be able to withstand a large current. In the semiconductor element 20 of the present embodiment, three wirings 13S are used, however the number of wirings 13S is not limited to this.

Moreover, for bonding, the length of one side of the source schottky pad 12S is preferably longer than the diameter of the wiring 13S. In the present embodiment, since the wiring having a diameter of 0.3 mm is used as the wiring 13S, the length of one side of the source schottky pad 12S may be 0.3 mm or more. To facilitate the bonding, it is preferable that the length of one side of the source schottky pad 12S be 0.6 mm or more as in the present embodiment. To further facilitate the bonding, it is more preferable that the length of one side of the source schottky pad 12S be 0.9 mm or more.

The gate pad 12G is connected by the wiring 13G. Herein, the wiring 13G is made of a metal, such as Al or Au. The gate pad 12G and the wiring 13G are connected to each other by pressing the wiring 13G against the gate pad 12G while applying ultrasound. In the semiconductor element 20 of the present embodiment, the wiring having a diameter of 0.3 mm is used as the wiring 13S for connecting the source schottky pads 12S each other. However, since a current supplied to the gate electrode 8 is not so large, it is preferable that a wiring having a shorter diameter be used as the wiring 13G which connects the gate pad 12G.

Next, a method for manufacturing the semiconductor element 20 constructed as above will be explained with reference to FIGS. 1 to 4. Note that the method itself will be explained in brief since it is constituted of known steps.

Drawings of respective manufacturing steps are omitted here. Therefore, when explaining the present manufacturing method, the reference numbers of the finished product shown in FIGS. 1 to 4 are used for convenience as the reference numbers of respective components in the process of manufacturing steps.

First, prepared is the semiconductor substrate 2 having an offcut surface which is inclined in a [11-20] direction at 8 degrees from an n$^+$-type 4H—SiC(0001)Si surface in which nitrogen is doped so that the nitrogen concentration is $3\times10^{18}$ cm$^{-3}$.

Next, after the semiconductor substrate 2 is cleaned, the SiC layer (semiconductor layer) 3 as a nitrogen-doped n$^-$-type epitaxial layer whose nitrogen concentration is adjusted to $1.3\times10^{16}$ cm$^{-3}$ is formed on the offcut surface by CVD so as to have a thickness of 10 μm.

Then, a mask (not shown) having openings is disposed on the surface of the SiC layer 3 such that the openings are located at appropriate positions of the surface of the SiC layer 3, multistage ion energy in a range of 30 to 700 keV directed toward the surface of the SiC layer 3 is suitably selected, and aluminum ion is implanted via the openings in a dose amount of $2\times10^{14}$ cm$^{-2}$. This ion implantation forms the p-type semiconductor regions 4, each having a depth of about 0.8 μm, on the surface of the SiC layer 3 like an island. Simultaneously, the guard ring 11 is also formed.

After that, using another mask (not shown) having openings being disposed on the surface of the p-type semiconductor region 4 such that the openings are located at appropriate positions of the surface of the p-type semiconductor region 4, nitrogen ion whose energy is 30 to 180 keV is implanted in the p-type semiconductor regions 4 in a dose amount of $1.4\times10^{15}$ cm$^{-2}$ so as to form the n$^+$-type source regions 5.

The semiconductor substrate 2 is subjected to an Ar atmosphere, kept at a temperature of 1,700 degrees C. and subjected to a heat treatment for about an hour, so that the above ion implanted regions are activated.

Next, the semiconductor substrate 2 is kept at a temperature of 1,100 degrees C. in an oxidation treatment furnace so as to be subjected to wet oxidation for three hours. This oxidation treatment forms a silicon oxide film, having a thickness of 40 nm, on the entire surface of the SiC layer 3.

A first opening for the source electrode and a second opening for the schottky electrode are patterned on the silicon oxide film using photolithography and etching. Thus, the silicon oxide film becomes the gate insulating film 7.

Then, an electrode made of Ni is selectively formed on the surface of the SiC layer 3 exposed in the first opening. The electrode formed in the first opening becomes the source electrode 6.

Next, the drain electrode 1 made of Ni is disposed on the rear surface of the semiconductor substrate 2.

After depositing these Ni layers, a suitable heat treatment is carried out. Thus, the electrodes 6 and 1 and the semiconductor are connected to each other in an ohmic manner.

Further, an electrode made of Ni is selectively formed on the surface of the SiC layer 3 exposed in the second opening. The electrode formed in the second opening becomes the schottky electrode 9a.

Then, the gate electrode 8 made of Al is formed on the surface of the gate insulating film 7.

Then, the interlayer insulating film 40 is formed on the surfaces of the source electrode 6, gate electrode 8 and schottky electrode 9a, and plugs, wirings and bonding pads 12S and 12G are suitably formed on the interlayer insulating film 40.

Next, the bonding pads 12S and 12G are suitably connected by the wirings 13S and 13G.

Thus, the semiconductor element 20 of the present embodiment is obtained.

Next, a comparison between a case where the field effect transistor 90 of the semiconductor element 20 is formed as a trench type and a case where it is formed as the planar type will be explained.

As the constructions of the field effect transistor, there are the planar type in which a p layer and an n layer are planarly formed on a semiconductor layer, and the trench type in which a thin, deep groove is formed and a gate electrode and a gate insulating film are embedded therein. The field effect transistor 90 in the semiconductor element 20 of the present embodiment adopts the planar type in consideration of various reasons, described below, such as a relation with the schottky diode 70.

For example, Published Japanese Translation of PCT Application No. 2005-501408 (hereinafter referred to as "prior example") discloses a construction in which a trench type MOSFET and a schottky diode are integrally formed. In this prior example, a schottky junction portion of a semiconductor and a metal is formed on a bottom surface of a trench (dug groove or hole) to construct a schottky diode. A trench portion of the above prior example is originally a portion constituting a gap of a transistor unit element portion, and is different from a transistor unit element (a plurality of square cells 200 arranged based on the virtual border lines 50, as in the present embodiment).

In contrast, a portion where the schottky diodes 70 of the present embodiment are formed occupies substantially the entire regions of part of the plurality of square cells 200 arranged based on the virtual border lines 50. Therefore, the portion where the schottky diodes 70 of the present embodiment are formed is totally different from the construction in which the schottky electrode is embedded in (the trench portion of) the gap in the prior example.

Like the semiconductor element 20 of the present embodiment, a combination of the planar type MOSFET 90 and the schottky diode 70 has such a structural flexibility that it is possible to arbitrarily select whether to dispose the MOSFET 90 on a plurality of square cells 200 arranged based on the virtual border lines 50 or dispose the schottky diode 70 on a plurality of square cells 200 arranged based on the virtual border lines 50. Therefore, the combination is advantageous over a case where the trench type MOSFET is adopted, like the prior example. With such structural flexibility, it is possible to embody one of features of the present invention, that is, it is possible to arbitrarily set the area ratio of a portion where the MOSFET 90 and the schottky diode 70 are disposed, to the entire semiconductor element 20.

Moreover, in the prior example, it is necessary to form the gate electrode on a trench wall surface with the gate insulating film disposed between the gate electrode and the trench wall surface, secure insulation by an interlayer insulating film, and further form the schottky electrode thereon. As above, in the case of forming the multilayer insulating film and electrode on the trench wall surface, it is impossible to form the schottky electrode, having a large area, on the bottom surface portion of the trench covered by the multilayer insulating film. Therefore, only a part of the bottom surface of the trench functions as the schottky diode. Therefore, the area for forming the schottky diode is limited to be small. In the case of the MOSFET 90 of the planar type, like the semiconductor element 20 of the present embodiment, the area is not limited.

Further, as in the prior example, in the case of forming the schottky electrode on the bottom surface of the trench, the schottky electrode is located near the drain electrode on the rear surface. Therefore, an electric field concentration occurs at the schottky electrode, so that the withstand voltage of the schottky electrode is a concern. In contrast, in the case of adopting the planar type MOSFET, the schottky electrode 9a is formed on the surface of the semiconductor layer 3, whereas the p-type semiconductor region 4 of the MOSFET 90 adjacent to the schottky electrode 9a is formed deep. Therefore, the electric field concentration does not occur at the schottky electrode 9a, and the withstand voltage is secured.

As described above, in the case of adopting the planar type MOSFET 90, like the semiconductor element 20 of the present embodiment, it is possible to arbitrarily set the area ratio of the MOSFET 90 and schottky diode 70 to the entire semiconductor element 20. Moreover, the planar type MOSFET 90 can also secure the withstand voltage, and the manufacturing process is simple. Therefore, the planar type MOSFET 90 is advantageous over the trench MOSFET shown in the prior example.

The foregoing explained an example in which nickel (Ni) is used as the material of the schottky electrode 9a. However, the material of the schottky electrode 9a is not limited to this, and may be titanium (Ti), aluminium (Al), molybdenum (Mo) or the like.

Next, an operational advantage of the semiconductor element 20 constructed as above will be explained.

The semiconductor element 20 of the present embodiment functions as a power device (3 mm square (square of 3 mm×3 mm), rated current of 20 A) having a withstand voltage of 600 V. In the semiconductor element 20 of the present embodiment, the source schottky pad 12S is disposed so as to be located above the schottky electrode 9a. Therefore, even if the wiring 13S is bonded to the source schottky pad 12S by pressing the wiring 13S against the source schottky pad 12S while applying ultrasound, the breakdown of the field effect transistor 90 formed in the transistor cell 100 and the deterioration of the withstand voltage of the gate insulating film 7 can be prevented since the diode cell 80 on which the schottky electrode 9a is disposed is disposed below the source schottky pad 12S.

In the semiconductor element 20 of the present embodiment, since the source electrode 6 contacts the p-type semiconductor region center portion 4b, and the n⁻-type drift region 3a below the p-type semiconductor region 4 is connected to the drain electrode 1 with the semiconductor substrate 2 disposed therebetween, a parasitic diode constituted of the drift region 3a and the p-type semiconductor region 4 exists between the source electrode 6 and the drain electrode 1. Moreover, in the semiconductor element 20 of the present embodiment, since the source electrode 6 is disposed so as to form a schottky junction with the drift region 3a, a schottky diode 70 constituted of the schottky electrode 9a and the drift region 3a exists between the source electrode 6 and the drain electrode 1.

When using the semiconductor element 20 of the present embodiment, such a voltage that the potential of the drain electrode 1 is higher than that of the source electrode 6 is applied between the source electrode 6 and the drain electrode 1. In this state, when a voltage (voltage to the source electrode 6) that is equal to or higher than the threshold value is applied to the gate electrode 8, an n channel is formed at an upper layer portion of the p-type semiconductor region 4 below the gate electrode 8. Then, electrons move from the source electrode 6 through the source region, the n channel, the drift region 3a and the semiconductor substrate 2 to the drain electrode 1. With this, the current flows from the drain electrode 1 to the source electrode 6.

Meanwhile, when the load is inductive, and the field effect transistor 90 is switched from ON to OFF, such a voltage that the potential of the source electrode 6 is higher than the potential of the drain electrode 1 is temporarily applied between the source electrode 6 and the drain electrode 1 by the load inductance. With this, the schottky diode 70 in the diode cell 80 is turned ON, and the current flows from the source electrode 6 to the drain electrode 1. Moreover, when the positive voltage of the source electrode 6 further increases, the parasitic diode of the field effect transistor 90 is turned ON, and the minority carriers (positive holes) are implanted into the drift region 3a. However, by designing the schottky electrode 9a to have a sufficiently large area, the ON-resistance of the schottky diode 70 can be set to be smaller than the ON-resistance of the parasitic diode. With this, the current preferentially flows to the schottky diode 70 in this case. As a result, the number of minority carriers implanted into the drift region 3a is reduced. Moreover, the implanted minority carriers are instantly absorbed by the schottky electrode 9a when the voltage applied between the source electrode 6 and the drain electrode 1 becomes such a voltage that the potential of the source electrode 6 is lower than the potential of the drain electrode 1. Therefore, the semiconductor element 20 can carry out the switching from ON to OFF at higher speed than the conventional examples. Moreover, since the area of a region where the schottky electrode 9a is disposed can be sufficiently made large, the current concentration on the schottky electrode 9a is prevented, and the breakdown of the semiconductor element 20 is suppressed.

Moreover, in the semiconductor element 20 of the present embodiment, since the diode forming region 9 is formed in the transistor forming region 10, the schottky junction having an energy barrier smaller than the p/n barrier existing in the field effect transistor 90 exists in the semiconductor element 20. When the surge voltage is applied to the semiconductor element 20, the leakage current preferentially flows to the schottky junction portion. With this, the surge voltage is relaxed, and the breakdown of the semiconductor element 20 is suppressed.

Further, regarding the surge current, since the schottky diode 70 and the parasitic diode (PN junction diode) are connected in parallel to each other, the schottky diode 70 allows the current to flow therethrough at high speed when the current has a certain current value (current value corresponding to a low region of a forward voltage Vf), and the parasitic diode allows the current to flow therethrough when the current has a larger current value (current value corresponding to a high region of the forward voltage Vf). Therefore, the breakdown by the current concentration on the schottky diode 70 is prevented.

Therefore, the semiconductor element 20 of the present invention has high resistance to the surge voltage and the surge current.

Even if the minority carriers are implanted into the p-type semiconductor region 4 and the source region 5 when the parasitic diode is ON, the minority carriers are absorbed by the schottky electrode 9a by the application of the reverse bias, so that the parasitic diode can be set to an OFF state immediately. With this, in the semiconductor element 20 of the present invention, it is possible to suppress the occurrence of so-called latch-up (that is, an OFF state cannot be realized quickly) which is a concern in the conventional semiconductor element having only a PN junction diode.

The schottky diode 70 constituting the semiconductor element 20 of the present embodiment uses the schottky electrode 9a made of Ni as the anode and the wide band-gap semiconductor (SiC in the present embodiment) as the cathode (semiconductor layer 3). The schottky diode 70 is preferable in view of the resistance to high current and resistance to high voltage since the silicide layer is not substantially formed at an interface between the semiconductor layer 3 and the schottky electrode 9a by a normally-performed conduction operation.

Assuming that the schottky diode is constructed using Ni as the anode (schottky electrode 9a) and Si (silicon) as the cathode (semiconductor layer 3), it becomes difficult to cause a large current to flow through the schottky diode. To be specific, in the schottky diode using Si as the cathode, the silicide layer is easily formed at an interface between Si and Ni. As a result, Si and Ni are connected to each other in an ohmic manner, and may not function as the diodes. This case may stand against such a principle of the present invention for solving the problems that the dielectric breakdown of the semiconductor element 20 is prevented by preferentially applying the leakage current, generated by the surge voltage, to the schottky diode 70.

Therefore, in the present embodiment, the structural difference regarding the cathode (difference regarding whether the semiconductor layer 3 is made of SiC or Si) is not just a design matter determined by a person with ordinary skill in the art, but a matter which directly leads to the above principle for solving the problems.

Further, the schottky diode 70 using SiC, that is the wide band-gap semiconductor, as the cathode (semiconductor layer 3) has more excellent withstand voltage property when the surge voltage is applied than the schottky diode using Si as the cathode (semiconductor layer 3).

Generally, the PN junction diode excels in the resistance to high current and resistance to high voltage. However, when the PN junction diode is constituted by using SiC that is the wide band-gap semiconductor, the conduction loss is generated due to the increase in the forward voltage Vf.

In accordance with the above, in the semiconductor element 20 of the present embodiment, it is preferable that the schottky diode 70 be constructed by using the wide band-gap semiconductor (SiC) as the semiconductor layer 3.

Next, Example of the present embodiment will be explained.

Example

In the present Example, a plurality of the semiconductor elements 20 of the present embodiment were manufactured, and the leakage current of the gate insulating film 7 was measured. The leakage current of 1 µA was confirmed in 5% of the semiconductor elements 20, and the yield was 95%. In contrast, in Comparative Example, manufactured were a plurality of semiconductor elements in each of which the diode forming region 9 is not disposed, the surface of the field effect transistor 90 is directly covered with the source schottky pad 12S, and the wiring is bonded, and the leakage current of the gate insulating film 7 was measured. The leakage current of 1 µA was confirmed in 30% of the semiconductor elements, and the yield was 70%. To be specific, in the semiconductor element 20 of the present embodiment, the source schottky pad 12S is disposed so as to cover the surface of the diode forming region 9, and the gate insulating film 7 is not formed on the diode forming region 9. Moreover, the schottky diode 70 located below the source schottky pad 12S has a higher strength with respect to ultrasound than the field effect transistor 90. Therefore, even in the case of pressing the wiring 13S against the source schottky pad 12S for bonding while applying ultrasound, the damage of the gate insulating film 7 is reduced, and the breakdown of the field effect transistor 90 is suppressed.

Embodiment 2

Embodiment 2 of the present invention exemplifies an inverter circuit which incorporates therein an arm module (semiconductor device) using the semiconductor element 20 of Embodiment 1.

Arm Module

Figure 5:
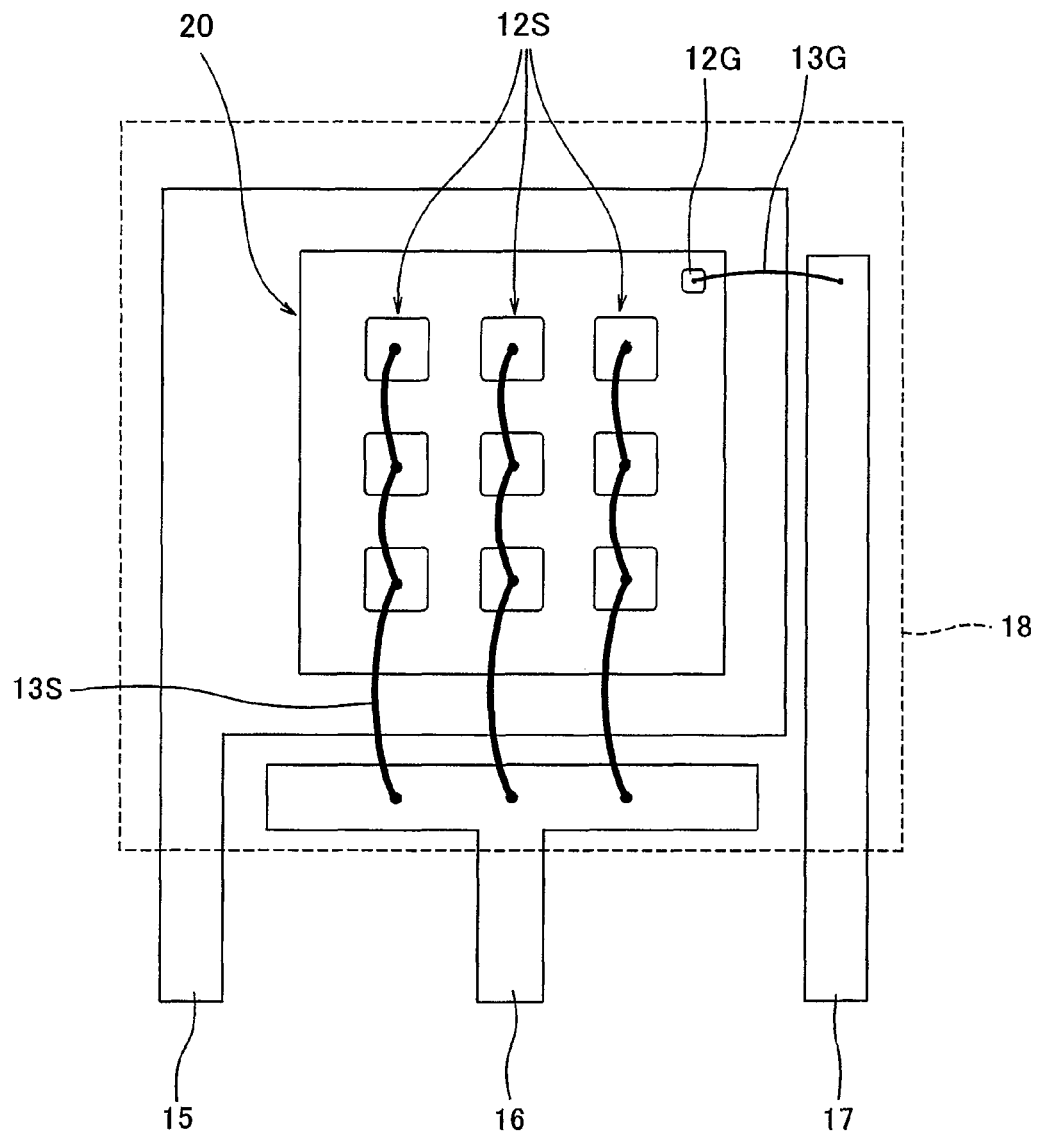
FIG. 5 is a plan view schematically showing the construction of an arm module as a semiconductor device according to Embodiment 2 of the present invention.

FIG. 5 is a plan view schematically showing the construction of the arm module as the semiconductor device according to Embodiment 2 of the present invention. In FIG. 5, the same reference numbers as in FIGS. 1 to 4 are used for the same or corresponding members, and explanations thereof are omitted.

As shown in FIG. 5, the arm module of the present embodiment includes the semiconductor element 20 of Embodiment 1 and a package having a drain electrode terminal 15, a source electrode terminal 16 and a gate electrode terminal 17.

The semiconductor element 20 is disposed on the drain electrode terminal 1 such that the drain electrode 1 is connected to an upper surface of the drain electrode terminal 15. The source schottky pads 12S of the semiconductor element 20 are connected to the source electrode terminal 16 by the wirings 13S, and the gate pad 12G of the semiconductor element 20 is connected to the gate electrode terminal 17 by the wiring 13G. The drain electrode 1 of the semiconductor element 20 and the drain electrode terminal 15 are connected to each other by die bonding. End portions of the wirings 13S and the source electrode terminal 16 are connected to each other by bonding, and an end portion of the wiring 13G and the gate electrode terminal 17 are connected to each other by bonding.

The semiconductor element 20 and the electrode terminals 15, 16 and 17 connected to each other are sealed (molded) by a sealing resin 18. As the sealing resin 18, a general-purpose resin can be used.

Inverter Circuit

Figure 6:
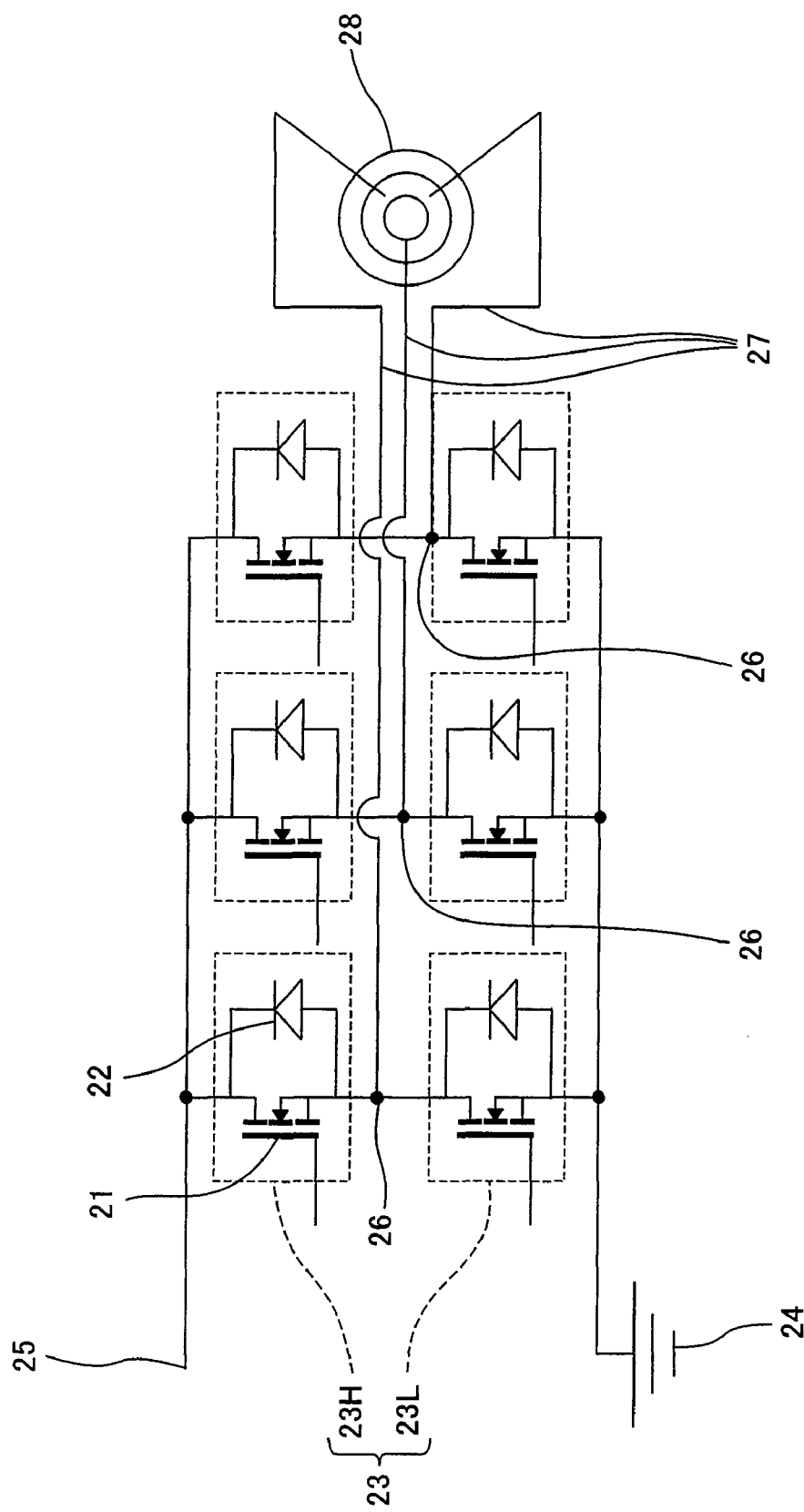
FIG. 6 is a circuit diagram showing the construction of an inverter circuit according to Embodiment 2 of the present invention.
Figure 9:
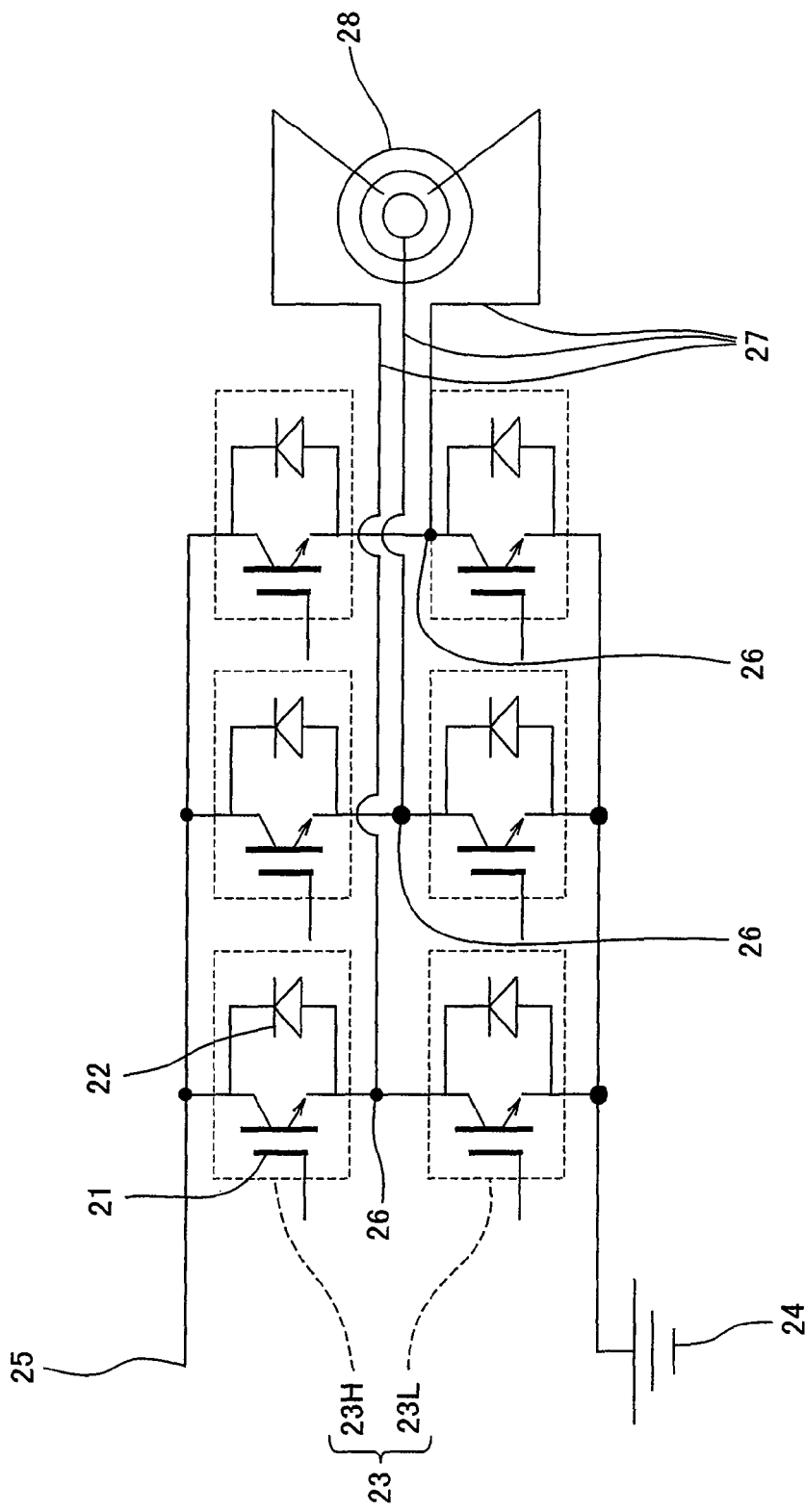
FIG. 9 is a circuit diagram schematically showing an inverter circuit for driving a three-phase motor which circuit is an application example of a conventional semiconductor element.

FIG. 6 is a circuit diagram showing the construction of an inverter circuit according to Embodiment 2 of the present invention. In FIG. 6, the same reference numbers as in FIG. 9 are used for the same or corresponding members, and explanations thereof are omitted.

The inverter circuit of the present embodiment is a circuit for driving a three-phase AC motor, and includes phase switching circuits 23, the number of which is equal to the number of phases (three, herein). Each circuit 23 is constructed by connecting an upper arm 23H and a lower arm 23L in series. Each of the upper arm 23H and the lower arm 23L is constituted of a switching element 21 and a diode 22 which are connected in parallel to each other. Each of the upper arm 23H and the lower arm 23L is constituted of the arm module of the present embodiment. The switching element 21 in each of the arms 23H and 23L is constituted of the field effect transistor 90 in the semiconductor element 20 of Embodiment 1. In contrast, the diode 22 is a feedback diode connected in parallel to the switching element 21, and is constituted of the schottky diode 70 in the semiconductor element 20 of Embodiment 1. Explanations of points other than the above are omitted since the explanations are made in Background Art.

In the present embodiment, the construction of the semiconductor element 20 of Embodiment 1 is studied using the inverter circuit.

Referring to FIGS. 2 to 4, in the semiconductor element 20, it is preferable that the ratio of the area of the schottky electrode 9a to the area of the semiconductor element 20 in plan view be not less than 1% and not more than 50%. Further, it is more preferable that the ratio of the area of the schottky electrode 9a to the area of the semiconductor element 20 in plan view be not less than 10% and not more than 50%.

First, the following will explain a case where the ratio of the area of the schottky electrode 9a to the area of the semiconductor element 20 in plan view is 1%. In the case of measuring the switching loss when such semiconductor element 20 is used as the arm module of the present embodiment, the reduction in the switching loss of 2% can be realized. Regarding the semiconductor element 20, the ON-resistance per unit area of the diode forming region 9 is about 1 m$\Omega$cm$^2$. In the case where the ratio of the area of the schottky electrode 9a to the area of the semiconductor element 20 in plan view is 1%, and the forward voltage Vf that is a voltage when causing the current to flow in a forward direction of the schottky diode 70 is about 3 V (the increase in the forward voltage Vf by a resistance component current is 2 V) including the forward rising voltage (1 V) generated by the schottky barrier, the current of about 20 A/cm$^2$ that is a current density of the entire element (2 A regarding the semiconductor element) can be applied. The forward voltage of 3 V is the lowest forward voltage when the forward current is applied to the parasitic diode of the semiconductor element 20 of the present invention. This is because SiC is used as the semiconducting material. Therefore, if the forward voltage Vf can be kept equal to or lower than 3 V when the forward current is applied to the schottky electrode 9a, the switching loss can be reduced compared to the conventional semiconductor element in which the schottky electrode 9a is not disposed.

At this time, the average ON-resistance per unit area of the transistor forming region 10 is about 1 digit larger than the ON-resistance per unit area of the diode forming region 9. Specifically, the average ON-resistance per unit area of the transistor forming region 10 is 10 m$\Omega$cm$^2$. Therefore, the current density (hereinafter referred to as "ON current density") when the field effect transistor 90 is ON is estimated at 200 A/cm$^2$ when the increase in the forward voltage Vf is 2 V. Note that the current (hereinafter referred to as "ON current") when the field effect transistor 90 is ON flows in a direction opposite the direction of the current flowing through the schottky diode 70.

Therefore, in a case where the current whose current density is about 1/10 of the ON current density of the field effect transistor 90 is applied to the schottky diode 70 in a direction opposite the direction of the ON current, it is preferable that the ratio of the area of the schottky electrode 9a to the area of the semiconductor element 20 in plan view be set to 1%.

In contrast, during an experiment of a continuous operation of the upper arm 23H and the lower arm 23L, the operations of the upper arm 23H and the lower arm 23L were not stable due to the heat generation of the upper arm 23H and the lower arm 23L in some cases. This is estimated to be caused since the value of the current flowing through the schottky diode 70 has exceeded the above-described allowable current value (20 A/cm$^2$). Therefore, it is preferable that the ratio of the area of the schottky electrode 9a be set such that the allowable current value is higher than the value of the current flowing through the schottky diode 70.

Next, the semiconductor element 20 is manufactured such that the ratio of the area of the schottky electrode 9a to the area of the semiconductor element 20 in plan view is 10%. When such semiconductor element 20 is used as the arm module, the reduction in the switching loss of 5% can be realized. In this case, the allowable value of the current flowing through the schottky diode 70 is 200 A/cm$^2$ that is the current density of the entire element (20 A regarding the semiconductor element). Since the allowable current value of 200 A/cm$^2$ is sufficiently high, the value of the current flowing through the schottky diode 70 does not exceed the allowable current value, so that the upper arm 23H and the lower arm 23L operate stably.

As described above, the average ON-resistance per unit area of the transistor forming region 10 is 10 m$\Omega$cm$^2$. Therefore, when the current whose current density is equal to the ON current density of the field effect transistor 90 is applied to the schottky diode 70 in a direction opposite the direction of the ON current, it is preferable that the ratio of the area of the schottky electrode 9a to the area of the semiconductor element 20 in plan view be set to 10%.

Next, the semiconductor element 20 is manufactured such that the ratio of the area of the schottky electrode 9a to the area of the semiconductor element 20 in plan view is 50%. When such semiconductor element 20 is used as the arm module, the reduction in the switching loss of 1% can be realized.

As described above, the average ON-resistance per unit area of the transistor forming region 10 is 10 m$\Omega$cm$^2$. However, it is thought that in the future, it is possible to reduce the ON-resistance per unit area of the transistor forming region 10 by, for example, the reduction in the channel resistance. As a result, the ON-resistance per unit area of the transistor forming region 10 becomes close to the ON-resistance (1 m$\Omega$cm$^2$) per unit area of the diode forming region 9. Although the ON-resistance of the transistor forming region 10 does not become smaller than the ON-resistance of the schottky diode forming region 9, these ON-resistances may become substantially equal to each other. In such a case, if the current density of the ON current flowing through the field effect transistor 90 and the current density of the ON current flowing through the schottky diode 70 are equal to each other, it is preferable that the ratio of the area of the schottky electrode 9a to the area of the semiconductor element 20 in plan view be set to 50%.

When the ratio of the area of the schottky electrode 9a to the area of the semiconductor element 20 in plan view is set to 10% or more, the heat generation of the semiconductor element 20 is also suppressed, so that the inverter circuit operates stably.

However, when the ratio of the area of the schottky electrode 9a to the area of the semiconductor element 20 in plan view is set to more than 50%, the ratio of the transistor cell 100 to the entire semiconductor element 20 decreases, so that the ON-resistance of the field effect transistor 90 increases, and the switching loss also increases.

If the current flowing through the schottky diode 70 is from 200 to 600 A/cm² that is the current density of the entire element, the semiconductor element 20 is expected to operate stably. Therefore, it is more preferable that the ratio of the area of the schottky electrode 9a to the area of the semiconductor element 20 in plan view be not less than 10% and not more than 30%.

As described above, when the value of the current flowing through the schottky diode 70 and the value of the current flowing through the field effect transistor 90 are equal to each other (flow directions of these currents are opposite to each other), and the ON-resistance of the diode forming region 9 is 1/10 of the ON-resistance of the transistor forming region 10, the ratio of the area of the schottky electrode 9a to the area of the semiconductor element 20 in plan view may be set to 10%. Moreover, when the ON-resistance of the diode forming region 9 is 1/3 of the ON-resistance of the transistor forming region 10, the ratio of the area of the schottky electrode 9a to the area of the semiconductor element 20 in plan view may be set to about 30%.

In accordance with the above results of the studies, in order that the semiconductor element 20 of Embodiment 1 fulfills its original functions as the switching element, it is preferable that the ratio of the area of all the transistor cells 100 in plan view to the area of the semiconductor element 20 in plan view be not less than 50% and not more than 99%. Further, in order that the semiconductor element 20 operates stably, it is more preferable that the ratio of the area of all the transistor cells 100 in plan view to the area of the semiconductor element 20 in plan view be not less than 70% and not more than 90%.

Embodiment 3

Figure 7:
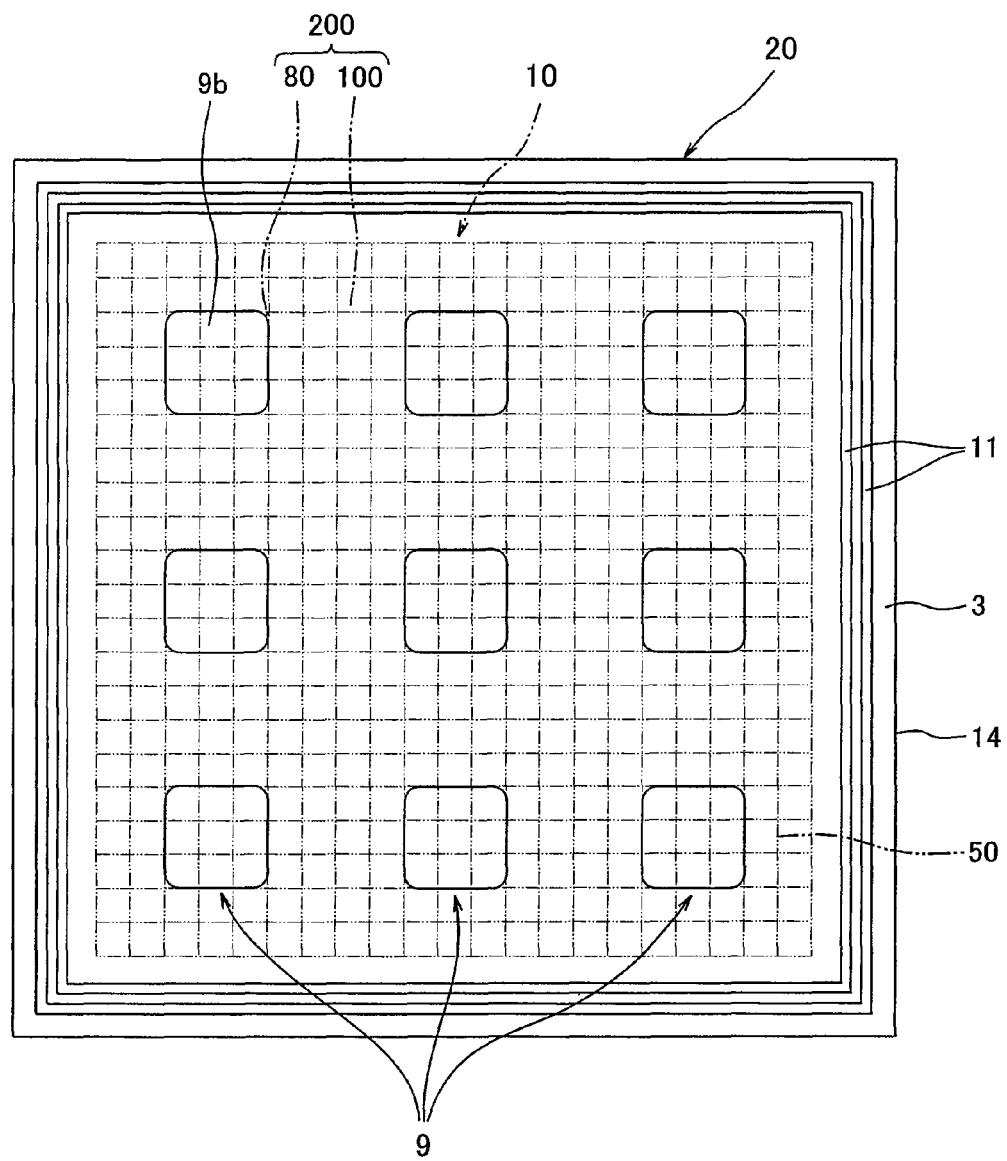
FIG. 7 is a plan view showing the construction of a semiconductor element of Embodiment 3 of the present invention.
Figure 8:
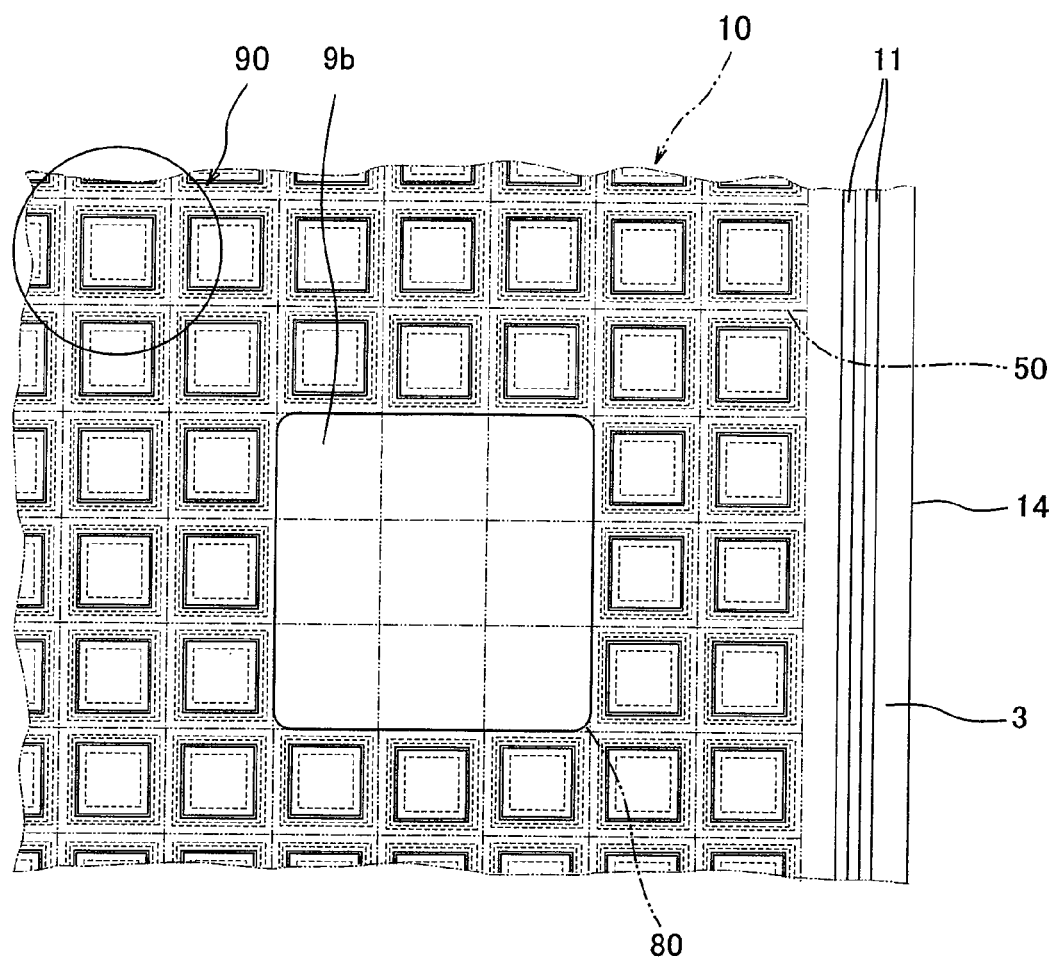
FIG. 8 is a partial plan view enlarging part of the construction of the semiconductor element of FIG. 7.

FIG. 7 is a plan view showing the construction of a semiconductor element of Embodiment 3 of the present invention. FIG. 8 is a partial plan view enlarging part of the construction of the semiconductor element of FIG. 7. In FIGS. 7 and 8, the same reference numbers as in FIGS. 1 to 3 are used for the same or corresponding members, and explanations thereof are omitted.

As shown in FIGS. 7 and 8, in the semiconductor element 20 of the present embodiment, the diode forming region 9 is constructed such that the schottky electrodes 9b which cover the upper surfaces of a plurality of diode cells 80 among the cells 200 defined by the lattice-like virtual border lines 50 in plan view are disposed inside the transistor forming region 10 like an island. Other than this point, the semiconductor element 20 of Embodiment 3 is the same as that of Embodiment 1.

Nine schottky electrodes 9b are disposed inside the transistor forming region 10. Note that the number of schottky electrodes 9b is not limited to this. To be specific, the number of schottky electrodes 9b may be changed by disposing the schottky electrode 9b on a plurality of cells 200 or by integrally forming all or part of the schottky electrodes 9b. Even in such a construction, the same effects as Embodiment 1 can be obtained. Moreover, with this construction, the number of components decreases, the semiconductor element 20 is easily manufactured, and the yield improves.

Also in the semiconductor element 20 of the present embodiment, to prevent the breakdown due to the electric field concentration, it is preferable that the corners of the schottky electrode 9b be rounded, as shown in FIGS. 7 and 8.

As with the semiconductor element 20 of Embodiment 1, the semiconductor element 20 of the present embodiment can be used in the arm module and the inverter circuit of Embodiment 2, and the same effects as the case of using the semiconductor element 20 of Embodiment 1 can be obtained. Moreover, it is preferable that the ratio of the area of all the transistor cells 100 in plan view to the area of the semiconductor element 20 of the present embodiment in plan view be not less than 50% and not more than 99%.

Note that Embodiments 1 to 3 explained the n channel type field effect transistor 90, however the present invention is applicable to the p channel type field effect transistor 90. In such a case, the conductivity types of respective semiconductor regions become opposite, and the source region and the drain region become opposite to each other, and the source electrode and the drain electrode become opposite to each other.

From the foregoing explanation, many modifications and other embodiments of the present invention are obvious to one skilled in the art. Therefore, the foregoing explanation should be interpreted only as an example, and is provided for the purpose of teaching the best mode for carrying out the present invention to one skilled in the art. The structures and/or functional details may be substantially modified within the spirit of the present invention.

INDUSTRIAL APPLICABILITY

A semiconductor element according to the present invention can realize both high-speed switching operation and energy loss reduction, excels in resistance to current concentration based on a counter electromotive voltage generate by, for example, an inductance load of an electrical apparatus, can suppress the deterioration of an insulating film of the field effect transistor at the time of wire bonding, and is applicable to, for example, a high-speed inverter power source circuit of an electrical apparatus.

The invention claimed is:
1. A semiconductor element comprising:
  a field effect transistor including:
    a semiconductor layer;
    a first source/drain region which is a first conductivity type and formed in said semiconductor layer so as to include an upper surface of said semiconductor layer;
    a second conductivity type region which is a second conductivity type and formed in said semiconductor layer so as to include the upper surface and said first source/drain region;
    a drift region which is a first conductivity type and formed in said semiconductor layer so as to include the upper surface and said second conductivity type region;
    a first source/drain electrode which is formed so as to contact at least the upper surface of said first source/drain region;
    a gate electrode which is formed so as to face at least the upper surface of said second conductivity type region with a gate insulating film provided between said gate electrode and said second conductivity type region; and
    a second source/drain electrode which is connected to said drift region in an ohmic manner;
  a schottky electrode which is disposed on the upper surface of said drift region so as to form a schottky junction with the upper surface of said drift region;
  an interlayer insulating film which covers the upper surface of said semiconductor layer, said first source/drain electrode, said gate electrode and said schottky electrode; and
  a plurality of bonding pads which are disposed on said interlayer insulating film and each of which is electri- cally connected to at least one of said first source/drain electrode, said gate electrode and said schottky electrode;

wherein: said semiconductor layer is divided into a plurality of cells by a virtual border line in plan view;

said drift region and said second source/drain electrode are formed so as to extend over the plurality of cells;

the plurality of cells are constituted of transistor cells in each of which said field effect transistor is formed and diode cells in each of which said schottky electrode is formed; and a bonding pad of said plurality of bonding pads is located above said schottky electrode of a diode cell such that said interlayer insulating film is between said bonding pad and said schottky electrode.

2. The semiconductor element according to claim 1, wherein said first source/drain electrode is disposed so as to contact said first source/drain region and the upper surface of said second conductivity type region.

3. The semiconductor element according to claim 1, wherein the first conductivity type is an n type, and the second conductivity type is a p type.

4. The semiconductor element according to claim 1, wherein said semiconductor layer is made of a wide band-gap semiconductor.

5. The semiconductor element according to claim 1, wherein in plan view, one or more diode cells are disposed like an island among a plurality of the transistor cells, and said bonding pads are located above said one or more diode cells, respectively, disposed like an island.

6. The semiconductor element according to claim 1, wherein said plurality of bonding pads are connected to each other by a wiring.

7. The semiconductor element according to claim 1, wherein said bonding pad has a square shape whose one side is 0.3 mm or more.

8. The semiconductor element according to claim 1, wherein a ratio of an area of all the transistor cells in plan view to an area of the semiconductor element in plan view is not less than 50% and not more than 99%.

9. The semiconductor element according to claim 1, wherein a ratio of an area of said schottky electrode to an area of the semiconductor element in plan view is not less than 1% and not more than 50%.

10. The semiconductor element according to claim 1, wherein an area of said schottky electrode in the diode cell is larger than an area of said second conductivity type region in the transistor cell in plan view.

11. An electrical apparatus comprising:
an AC driving device; and
the semiconductor element according to claim 1, constituting an inverter power source circuit of said AC driving device,
wherein the semiconductor element is incorporated as an arm module.

12. The electrical apparatus according to claim 11, wherein a voltage applied to a parasitic diode of said field effect transistor and a schottky diode, which is constituted of said drift region and said schottky electrode forming the schottky junction with the upper surface of said drift region, based on a counter electromotive voltage generated by an inductance load in said AC driving device is higher than a forward rising voltage of the schottky diode and lower than a forward rising voltage of the parasitic diode.

13. The electrical apparatus according to claim 11, wherein said AC driving device is an AC motor driven by the inverter power source circuit.

* * * * *